(12) United States Patent
Papasouliotis et al.

(10) Patent No.: US 9,123,509 B2
(45) Date of Patent: Sep. 1, 2015

(54) TECHNIQUES FOR PLASMA PROCESSING A SUBSTRATE

(75) Inventors: George D. Papasouliotis, North Andover, MA (US); Kamal Hadidi, Somerville, MA (US); Helen L. Maynard, North Reading, MA (US); Ludovic Godet, Boston, MA (US); Vikram Singh, North Andover, MA (US); Timothy J. Miller, Ipswich, MA (US); Bernard Lindsay, Danvers, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 1045 days.

(21) Appl. No.: 13/157,005

(22) Filed: Jun. 9, 2011

(65) Prior Publication Data

US 2011/0309049 A1 Dec. 22, 2011

Related U.S. Application Data

(63) Continuation-in-part of application No. 12/105,761, filed on Apr. 18, 2008, now abandoned, which is a continuation-in-part of application No. 11/771,190, filed on Jun. 29, 2007, now abandoned, application (Continued)

(51) Int. Cl.
*H01J 37/32* (2006.01)

(52) U.S. Cl.
CPC ....... *H01J 37/32146* (2013.01); *H01J 37/3244* (2013.01); *H01J 37/32412* (2013.01)

(58) Field of Classification Search
CPC .............. H01J 37/34212; H01J 37/32146; H01J 37/32422; H01L 21/3065; C23C 14/00; C23C 16/00
See application file for complete search history.

(56) References Cited

U.S. PATENT DOCUMENTS

| | | |
|---|---|---|
| 5,005,066 A | 4/1991 | Chen |
| 5,289,010 A | 2/1994 | Shohet |

(Continued)

FOREIGN PATENT DOCUMENTS

| | | |
|---|---|---|
| EP | 1973140 A2 | 9/2008 |
| JP | 10-4085 A | 1/1998 |

(Continued)

OTHER PUBLICATIONS

Gianturco (Journal of chemical physics 57, 840 (1972)).*

(Continued)

*Primary Examiner* — Joel Horning

(57) ABSTRACT

Techniques for plasma processing a substrate are disclosed. In one particular exemplary embodiment, the technique may be realized with a method comprising introducing a feed gas proximate to a plasma source, where the feed gas may comprise a first and second species, where the first and second species have different ionization energies; providing a multi-level RF power waveform to the plasma source, where the multi-level RF power waveform has at least a first power level during a first pulse duration and a second power level during a second pulse duration, where the second power level may be different from the first power level; ionizing the first species of the feed gas during the first pulse duration; ionizing the second species during the second pulse duration; and providing a bias to the substrate during the first pulse duration.

19 Claims, 15 Drawing Sheets

Related U.S. Application Data

No. 13/157,005, which is a continuation-in-part of application No. 12/098,781, filed on Apr. 7, 2008, which is a continuation of application No. 11/771,190.

(60) Provisional application No. 61/353,953, filed on Jun. 11, 2010.

(56) References Cited

U.S. PATENT DOCUMENTS

| | | |
|---|---|---|
| 5,444,259 A | 8/1995 | Ohmi |
| 5,508,227 A | 4/1996 | Chan et al. |
| 5,846,883 A | 12/1998 | Moslehi |
| 6,016,131 A | 1/2000 | Sato et al. |
| 6,051,503 A | 4/2000 | Bhardwaj et al. |
| 6,214,162 B1 | 4/2001 | Koshimizu |
| 6,237,527 B1 | 5/2001 | Kellerman et al. |
| 6,253,704 B1 * | 7/2001 | Savas .................. 118/723 I |
| 6,261,962 B1 | 7/2001 | Bhardwaj et al. |
| 6,319,355 B1 | 11/2001 | Holland |
| 6,524,432 B1 | 2/2003 | Collins et al. |
| 6,589,437 B1 | 7/2003 | Collins |
| 7,453,059 B2 | 11/2008 | Koo et al. |
| 7,524,743 B2 | 4/2009 | Gupta et al. |
| 7,820,533 B2 | 10/2010 | Miller et al. |
| 2002/0160125 A1 | 10/2002 | Johnson et al. |
| 2002/0189544 A1 | 12/2002 | Hedberg et al. |
| 2003/0175444 A1 | 9/2003 | Huang et al. |
| 2004/0124177 A1 * | 7/2004 | Urban et al. ............... 216/67 |
| 2005/0006226 A1 | 1/2005 | Baldwin et al. |
| 2005/0034816 A1 | 2/2005 | Shannon et al. |
| 2005/0106873 A1 | 5/2005 | Hoffman et al. |
| 2005/0205212 A1 | 9/2005 | Singh et al. |
| 2005/0241762 A1 | 11/2005 | Paterson et al. |
| 2005/0245087 A1 | 11/2005 | Sasagawa et al. |
| 2005/0260837 A1 | 11/2005 | Walther et al. |
| 2005/0263390 A1 | 12/2005 | Gung et al. |
| 2006/0019477 A1 | 1/2006 | Hanawa et al. |
| 2006/0027451 A1 | 2/2006 | Park et al. |
| 2006/0121704 A1 | 6/2006 | Walther et al. |
| 2006/0236931 A1 | 10/2006 | Singh et al. |
| 2007/0084564 A1 | 4/2007 | Gupta et al. |
| 2007/0087574 A1 | 4/2007 | Gupta et al. |
| 2007/0170867 A1 | 7/2007 | Persing et al. |
| 2007/0224840 A1 | 9/2007 | Renau et al. |
| 2007/0227231 A1 | 10/2007 | Koo et al. |
| 2007/0281489 A1 | 12/2007 | Pandhumsoporn et al. |
| 2008/0132046 A1 | 6/2008 | Walther |
| 2008/0169183 A1 | 7/2008 | Hertel et al. |
| 2008/0200015 A1 | 8/2008 | Miller et al. |
| 2009/0000946 A1 | 1/2009 | Singh et al. |
| 2009/0001890 A1 | 1/2009 | Singh et al. |
| 2009/0004836 A1 | 1/2009 | Singh et al. |
| 2009/0227096 A1 | 9/2009 | Godet et al. |
| 2009/0255800 A1 | 10/2009 | Koshimizu |
| 2013/0092529 A1 | 4/2013 | Singh et al. |

FOREIGN PATENT DOCUMENTS

| | | |
|---|---|---|
| JP | 10-135192 A | 5/1998 |
| JP | 10-150025 A | 6/1998 |
| JP | 10-312899 A | 11/1998 |
| JP | 11-224796 A | 8/1999 |
| JP | 2003-507880 A | 2/2003 |
| JP | 2003-073814 A | 3/2003 |
| JP | 2008-205436 A | 9/2008 |
| WO | 0112873 A1 | 2/2001 |

OTHER PUBLICATIONS

NIST data for argon (retrieved May 21, 2014 from http://physics.nist.gov/PhysRefData/Handbook/Tables/argontable1.htm).*

Iga Z. (Phys. D—Atoms, Molecules and Clusters 24, 111-115 (1992)).*

International Search Report mailed Aug. 29, 2008 in co-pending PCT application No. PCT/US2008/066703.

Written Opinion of the International Searching Authority mailed Aug. 29, 2008 in co-pending PCT application No. PCT/US2008/066703.

International Search Report mailed Sep. 22, 2011 in corresponding PCT application No. PCT/US2011/040206.

Written Opinion of the International Searching Authority mailed Sep. 22, 2011 in corresponding PCT application No. PCT/US2011/04020.

Fundamentals of Plasma Chemistry, Chapter 1 (1974), pp. 1-3, Bell.

Plasma Immersion Ion Implantation for ULSI Devices, 1995, p. 337, University of California, Berkeley, CA, USA, Cheung, et al.

Plasma Immersion Ion Implantation As an Alternative Deep Trench Buried-Plate Doping Technology, IEEE, 2000, pp. 460-463, Lee, et al.

Vacuum Technology & Coating, Mar. 2008, High Power Pulsed Magnetron Sputtering (HPPMS), Process Technology Tutorial, pp. 44-47, Martin.

Trench Doping Conformality by Plasma Immersion Ion Implantation (PII), IEEE, 1994, pp. 196-198, University of California, Berkeley, CA, USA, Yu, et al.

* cited by examiner

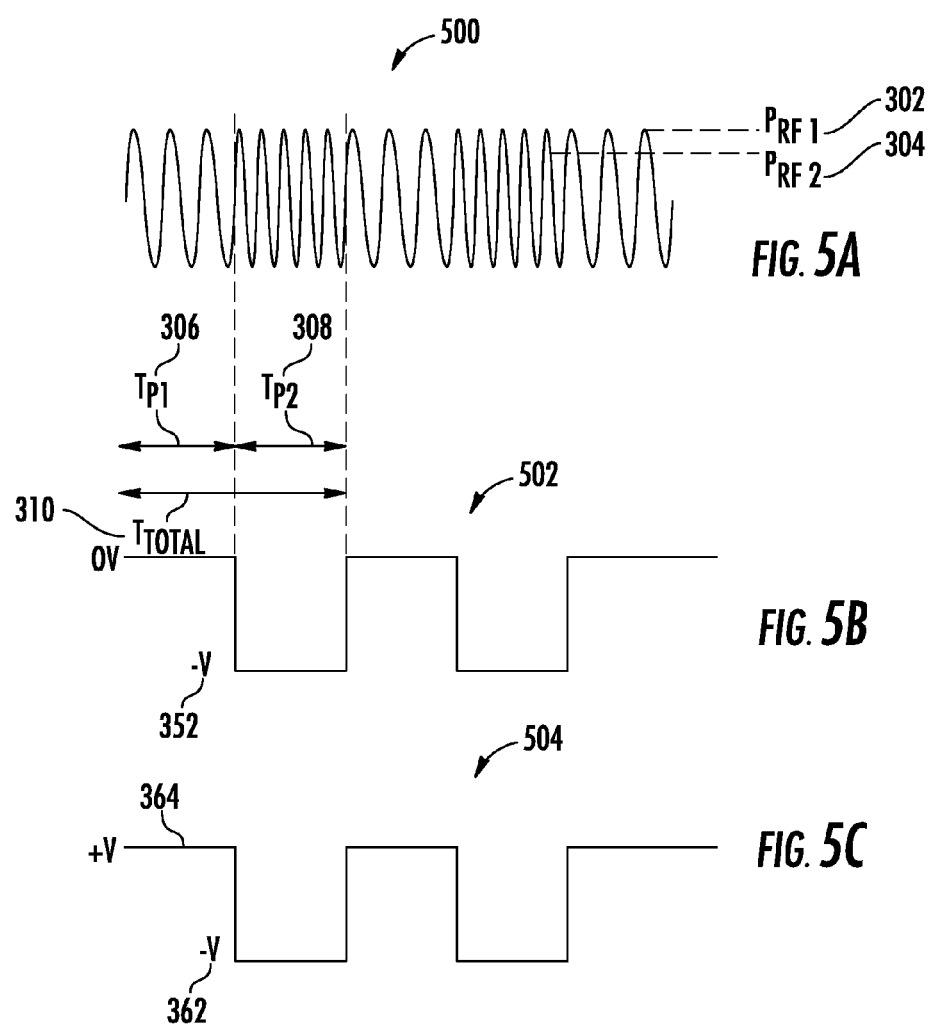

US 9,123,509 B2

TECHNIQUES FOR PLASMA PROCESSING A SUBSTRATE

PRIORITY

This application is a non-provisional application and claims priority to U.S. Provisional Patent Application Ser. No. 61/353,953, filed on Jun. 11, 2010. This application is also a continuation-in-part application and claims priority to U.S. patent application Ser. No. 12/105,761, filed on Apr. 18, 2008 now abandoned, which is a continuation-in-part application and claims priority to U.S. patent application Ser. No. 11/771,190, filed Jun. 29, 2007 now abandoned. This application is also a continuation-in-part application and claims priority to U.S. patent application Ser. No. 12/098,781, filed on Apr. 7, 2008, which is a continuation application and claims priority to U.S. patent application Ser. No. 11/771,190, filed Jun. 29, 2007 now abandoned. The entire specification of each of U.S. Provisional Patent Application Ser. No. 61/353,953; U.S. patent application Ser. No. 12/105,761; U.S. patent application Ser. No. 12/098,781; and U.S. patent application Ser. No. 11/771,190 is incorporated herein by reference.

FIELDS

This application is related to techniques for processing a substrate, more particularly to the techniques for processing a substrate using plasma.

BACKGROUND

Plasma processing has been widely used in the semiconductor and other industries for many decades. Plasma processing is used for tasks such as cleaning, etching, milling, and deposition. More recently, plasma processing has been used for doping. Plasma assisted doping (PLAD) or sometimes referred to as plasma immersion ion implantation (PIII) have been used to meet the doping requirements of some modern electronic and optical devices. Plasma doping is different from the conventional beam-line ion implantation systems that accelerate ions with an electric field and then filter the ions according to their mass-to-charge ratio to select the desired ions for implantation. Unlike the conventional beam-line ion implantation systems, PLAD systems immerse the substrate in a plasma containing dopant ions and bias the substrate with a series of negative voltage pulses. The electric field within the plasma sheath accelerates ions toward the substrate thereby implanting the ions into the surface of the substrate.

Plasma doping systems for the semiconductor industry generally require a very high degree of process control. Conventional beam-line ion implantation systems that are widely used in the semiconductor industry have excellent process control and also excellent run-to-run uniformity. Conventional beam-line ion implantation systems provide highly uniform doping across the entire surface of state-of-the-art semiconductor substrates.

In general, the process control of PLAD systems is not as good as conventional beam-line ion implantation systems. In many plasma doping systems, charge tends to accumulate on the substrate being plasma doped. This charge build-up can result in the development of a relatively high potential voltage on the substrate that can cause unacceptable doping non-uniformities and arcing, which can result in device damage. Additionally, the composition of the plasma can affect the resulting process step. For example, a large number of inert gas ions may cause more damage to the substrate than desired. In addition, the electron temperature may alter the desired numbers of ions in the plasma.

SUMMARY

Techniques for plasma processing a substrate are disclosed. In one particular exemplary embodiment, the technique may be realized with a method comprising introducing a feed gas proximate to a plasma source, where the feed gas may comprise a first and second species, where the first and second species have different ionization energies; providing a multi-level RF power waveform to the plasma source, where the multi-level RF power waveform has at least a first power level during a first pulse duration and a second power level during a second pulse duration, where the second power level may be different from the first power level; ionizing the first species of the feed gas during the first pulse duration; ionizing the second species during the second pulse duration; and providing a bias to the substrate during the first pulse duration.

In accordance to another aspect of this particular exemplary embodiment, the method may further comprise providing a bias to the substrate during the second pulse duration.

In accordance to further aspect of this particular exemplary embodiment, the first power level may be greater than a power level necessary to ionize the first species but less than another power level necessary to ionize the second species.

In accordance with additional aspect of this particular exemplary embodiment, the second power level may be applied when the substrate is not biased.

In accordance with yet additional aspect of this particular exemplary embodiment, the first species may comprise processing species.

In accordance with yet another aspect of this particular exemplary embodiment, the processing species may comprise at least one of B, P, Ge, As, and Se, and the second species may comprise at least one of C, O, He, Ne, and Ar.

In accordance with still another aspect of this particular exemplary embodiment, the processing species may be an etchant so as to etch the substrate.

In accordance with another aspect of this particular exemplary embodiment, the method may further comprise biasing the substrate during at least a portion of the second pulse duration.

Yet in accordance with another aspect of this particular exemplary embodiment, the method may further comprise selectively directing first ions of the processing species toward the substrate during the first pulse duration; and directing the second ions of the inert species toward the substrate during the second pulse duration.

Still in accordance to another aspect of this particular exemplary embodiment, the second RF power level may be sufficient to stabilize the plasma.

In another particular exemplary embodiment, the technique may be realized with a method comprising introducing a feed gas comprising a first species and second species near a plasma source, the first species having lower ionization energy than the second species; applying first power level to the plasma source during a first period to selectively ionize the first species, where the first power level may be greater than a power level necessary to ionize the first species but less than another power level necessary to ionize the second species; applying second power level to the plasma source during a second period to ionize the second species, where the second power level may be greater than the another power level necessary to ionize the second species; and directing ions of the first species toward a substrate during a first period.

In accordance to another aspect of this particular exemplary embodiment, the method may further comprise directing ions of the second species toward the substrate during a second period.

In accordance to further aspect of this particular exemplary embodiment, the method may further comprise implanting ions of the first species into the substrate during the first period; and implanting ions of the second species into the substrate during the second period.

In accordance with additional aspect of this particular exemplary embodiment, the first species may comprise at least one of P, B, and As, and the second species may comprise at least one of C, O, He, Ne, and Ar.

In accordance with yet additional aspect of this particular exemplary embodiment, the method may further comprise biasing the substrate during the first period and biasing the substrate during the second period.

In accordance with yet another aspect of this particular exemplary embodiment, the method may further comprise biasing the substrate during the first period without biasing the substrate during the second period.

Yet in another particular exemplary embodiment, the technique may be realize with a method may be achieved by plasma processing a substrate in an apparatus comprising a plasma source proximate to a substrate, an RF power supply electrically coupled to the plasma source, a bias power supply electrically coupled to the substrate. In this embodiment, the method may comprise introducing a feed gas proximate to the plasma source, the feed gas comprising at least first and second species; generating an RF waveform having a first power level during a first period and a second power level during a second period with the RF power supply, where the second period may occur after the first period; applying the RF waveform during the first and second period to the plasma source to generate plasma; generating a bias waveform with the bias power supply, the bias waveform having a first bias level and a second bias level, the first bias level being zero bias level; and applying the bias waveform to the substrate to direct ions from the plasma toward the substrate.

In accordance with another aspect of this particular exemplary embodiment, the second power level may be greater than the first power level.

In accordance to another aspect of this particular exemplary embodiment, the first bias level may be applied to the substrate during the first period.

In accordance to further aspect of this particular exemplary embodiment, the second bias level may be applied to the substrate after the second period.

In accordance with additional aspect of this particular exemplary embodiment, the second bias level may be applied to the substrate during the second period.

In accordance with yet additional aspect of this particular exemplary embodiment, the second bias level may be applied to the substrate during the first period.

In accordance with yet another aspect of this particular exemplary embodiment, the RF waveform may further comprise a third power level during a third period, where the third power level may be less than the first and second power levels, where the third period occurs after the second period, and where the first bias level may be applied to the substrate during the third period.

In accordance with still another aspect of this particular exemplary embodiment, the plasma is not extinguished during the third period.

BRIEF DESCRIPTION OF THE DRAWINGS

In order to facilitate a fuller understanding of the present disclosure, reference is now made to the accompanying drawings. These figures may not necessarily be drawn to scale. In addition, these figures should not be construed as limiting the present disclosure, but are intended to be exemplary only.

FIGS. 5A-C illustrate a RF power waveform generated by the RF source and bias voltage waveforms generated by the bias voltage supply according to another embodiment of the present disclosure.

DETAILED DESCRIPTION

Figure 1A:
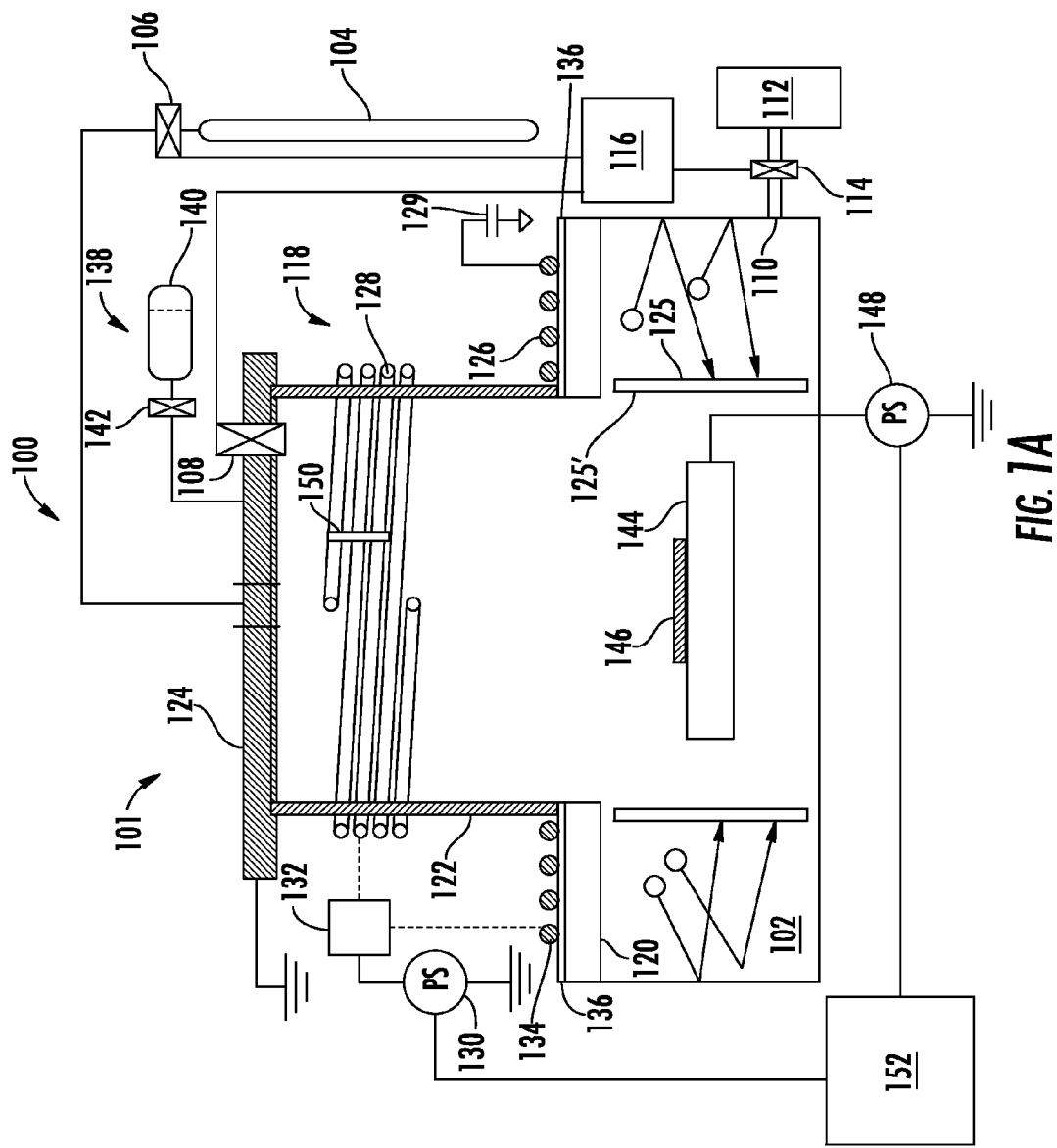
FIG. 1A illustrates an exemplary plasma processing system according to one embodiment of the present disclosure.

Herein, several embodiments of new techniques for processing a substrate using plasma based system are introduced. For purpose of clarity and simplicity, processing performed on the substrate may focus on doping, etching, and deposition processes. However, other types of processing including passivation of substrate surface are not precluded in the present disclosure. Accordingly, the systems disclosed in the present disclosure need not be limited to particular systems (e.g. doping system, etching system, deposition system, etc. . . . ) performing particular processes.

The systems disclosed herein may include one or more plasma sources for generating plasma. For the purposes of clarity and simplicity, the present disclosure will focus on inductively coupled plasma (ICP) sources. However, those of ordinary skill in the art will recognize that other sources including capacitively coupled plasma (CCP) sources, helicon plasma sources, microwave (MW) plasma sources, glow discharge plasma sources, and other types of plasma sources are not precluded in the present disclosure. The plasma source may be near or proximate to the area where the substrate is processed. Alternatively, the sources may be remote plasma sources, removed from the area where the substrate is processed. The power applied to the plasma source may be continuous or pulsed, DC or RF power having positive or negative bias. For the purposes of the clarity and simplicity, the present disclosure may focus on pulsed, RF power applied to ICP source.

Reference in the present disclosure to "one embodiment" or "an embodiment" means that a particular feature, structure, or characteristic described in connection with the embodiment is included in at least one embodiment of the present disclosure. The appearances of the phrase "in one embodiment" in various places in the specification are not necessarily all referring to the same embodiment.

It should be understood that the individual steps of the methods of the present disclosure may be performed in any order and/or simultaneously as long as the systems or techniques disclosed herein remain operable. Furthermore, it should be understood that the systems and methods of the present disclosure can include any number or all of the described embodiments as long as the systems and methods remains operable.

The present teachings will now be described in more detail with reference to exemplary embodiments thereof as shown in the accompanying drawings. While the present teachings are described in conjunction with various embodiments and examples, it is not intended that the present teachings be limited to such embodiments. On the contrary, the present teachings encompass various alternatives, modifications and equivalents, as will be appreciated by those of skill in the art. Those of ordinary skill in the art having access to the teachings herein will recognize additional implementations, modifications, and embodiments, as well as other fields of use, which are within the scope of the present disclosure as described herein. For example, it should be understood that the methods for neutralizing charge in a plasma processing system according to the present invention can be used with any type of plasma source.

Many plasma processing systems operate in a pulsed mode of operation where a series of pulses is applied to the plasma source to generate pulsed plasma. Also, a series of pulses can be applied to the substrate being plasma processed during the on-periods of the plasma source pulses, which biases the substrate to attract ions for implantation, etching, or deposition. In the pulsed mode of operation, charge tends to accumulate on the substrate being plasma processed during the on-period of the plasma source pulses. When the duty cycle of the plasma source pulses is relatively low (i.e. less than about 25% and sometimes less than 2% depending upon process parameters), the charge tends to be efficiently neutralized by electrons in the plasma and there are only minimal charging effects.

However, there is currently a need to perform plasma processing in a pulsed mode of operation with relatively high duty cycles (i.e. duty cycles above about 2%). Such higher duty cycles are necessary to achieve the desired throughputs and to maintain etching rates, deposition rates, and doping levels that are required for some modern devices. For example, it is desirable to perform poly gate doping and counter doping of some state-of-the art devices by plasma doping with a duty cycle greater than 2%. In addition, it is desirable to perform many plasma etching and deposition processes at duty cycles greater than 2% to increase process throughput to acceptable levels.

As the duty cycle is increased above about 2%, there is a relatively short period of time where the charge on the substrate being plasma processed can be neutralized during the pulse-off period of the plasma source. Consequently, charge accumulation or charge build up can occur on the substrate being plasma processed, which results in the development of a relatively high potential voltage on the substrate being plasma processed that can cause plasma processing non-uniformities, arcing, and substrate damage. For example, substrates containing thin gate dielectrics can be easily damaged by excess charge build up.

The present invention relates to methods and apparatus for neutralizing charge during plasma processing. The method and apparatus of the present invention allow plasma processing to be performed at higher duty cycles by reducing the probability of damage caused by charging effects. In particular, a plasma processing apparatus according to the present invention includes a RF power supply that varies the RF power applied to the plasma source to at least partially neutralize charge accumulation during plasma processing. In addition, the bias voltage to the substrate being plasma processed can be varied to at least partially neutralize charge accumulation. Furthermore, in some embodiment of the invention, the RF power pulses applied to the plasma source and the bias voltage applied to the substrate are synchronized in time and the relative timing of the RF power pulses applied to the plasma source and the bias voltage applied to the substrate being plasma processed is varied to at least partially neutralize charge accumulation on the substrate and/or to achieve certain process goals.

More specifically, in various embodiments, single or multiple RF power supplies are used to independently power the plasma source and bias the substrate being plasma processed so as to at least partially neutralize charge during plasma processing. Also, in various embodiments, the RF power applied to the plasma source and the bias voltage applied to the substrate during plasma processing are applied at relative times to at least partially neutralize charge during plasma processing.

In addition to neutralizing charge, the method and apparatus of the present invention can precisely control at least one of the power to the RF source and the bias applied to the substrate during periods where the plasma processing is terminated (i.e. pulse-off period) in order to achieve certain process goals. For example, the method and apparatus of the present invention can precisely control at least one of the powers to the RF source and the bias voltage applied to the substrate during the pulse-off period in order to allow chemical reactions to occur on the surface of the substrate. Such a capability can improve throughput and provide more process control in some etching and deposition processes.

In addition, the method and apparatus of the present invention for plasma doping can precisely control at least one of the power to the RF source and the bias voltage applied to the substrate during the pulse-off period in order to improve the retained dose while plasma doping. The resulting improvement in retained dose will reduce the implant time and thus, will increase plasma doping throughput. In addition to neutralizing charge, the method and apparatus of the present invention can precisely control at least one of the power to the RF source and the bias applied to the substrate during periods where the plasma doping is terminated in order to achieve knock-on type ion implant mechanisms that achieve improved sidewall plasma doping profiles and retrograde doping profiles as describe herein.

Referring to FIG. 1A, there is shown a plasma processing system 100 according to one embodiment of the present disclosure. It should be understood that this is only one of many possible designs of apparatus that can perform plasma processing, such as ion implantation, deposition, and etching, according to the present disclosure. In particular, it should be understood that there are many possible plasma sources that can be used with the plasma processing system of the present disclosure. The plasma source shown in FIG. 1 includes both a planar and a helical RF coil. Other embodiments include a single planar or a helical RF coil. Still other embodiments include capacitively coupled plasma sources or electron cyclotron resonance plasma sources. One skilled in the art will appreciate that there are many types of equivalent plasma sources.

The plasma processing system 100 includes an inductively coupled plasma source 101 having both a planar and a helical RF coil and a conductive top section. A similar RF inductively coupled plasma source is described in U.S. patent application Ser. No. 10/905,172, filed on Dec. 20, 2004, entitled "RF Plasma Source with Conductive Top Section," which is assigned to the present assignee. The entire specification of U.S. patent application Ser. No. 10/905,172 is incorporated herein by reference. The plasma source 101 shown in the plasma processing system 100 is well suited for plasma doping and other precise plasma processing applications that require highly uniform processing because it can provide a very uniform ion flux. In addition, the plasma source 101 is useful for high power plasma processing because it efficiently dissipates heat generated by secondary electron emissions.

More specifically, the plasma processing system 100 includes a plasma chamber 102 that contains a process gas supplied by an external gas source 104. The external gas source 104, which is coupled to the plasma chamber 102 through a proportional valve 106, supplies the process gas to the chamber 102. In some embodiments, a gas baffle is used to disperse the gas into the plasma source 101. A pressure gauge 108 measures the pressure inside the chamber 102. An exhaust port 110 in the chamber 102 is coupled to a vacuum pump 112 that evacuates the chamber 102. An exhaust valve 114 controls the exhaust conductance through the exhaust port 110.

A gas pressure controller 116 is electrically connected to the proportional valve 106, the pressure gauge 108, and the exhaust valve 114. The gas pressure controller 116 maintains the desired pressure in the plasma chamber 102 by controlling the exhaust conductance and the process gas flow rate in a feedback loop that is responsive to the pressure gauge 108. The exhaust conductance is controlled with the exhaust valve 114. The process gas flow rate is controlled with the proportional valve 106.

In some embodiments, a ratio control of trace gas species is provided to the process gas by a mass flow meter that is coupled in-line with the process gas that provides the primary dopant species. Also, in some embodiments, a separate gas injection means is used for in-situ conditioning species. Furthermore, in some embodiments, a multi-port gas injection means is used to provide gases that cause neutral chemistry effects that result in across substrate variations.

The chamber 102 has a chamber top 118 including a first section 120 formed of a dielectric material that extends in a generally horizontal direction. A second section 122 of the chamber top 118 is formed of a dielectric material that extends a height from the first section 120 in a generally vertical direction. The first and second sections 120, 122 are sometimes referred to herein generally as the dielectric window. It should be understood that there are numerous variations of the chamber top 118. For example, the first section 120 can be formed of a dielectric material that extends in a generally curved direction so that the first and second sections 120, 122 are not orthogonal as described in U.S. patent application Ser. No. 10/905,172, which is incorporated herein by reference. In other embodiments, the chamber top 118 includes only a planer surface.

The shape and dimensions of the first and the second sections 120, 122 can be selected to achieve a certain performance. For example, one skilled in the art will understand that the dimensions of the first and the second sections 120, 122 of the chamber top 118 can be chosen to improve the uniformity of plasmas. In one embodiment, a ratio of the height of the second section 122 in the vertical direction to the length across the second section 122 in the horizontal direction is adjusted to achieve a more uniform plasma. For example, in one particular embodiment, the ratio of the height of the second section 122 in the vertical direction to the length across the second section 122 in the horizontal direction is in the range of 1.5 to 5.5.

The dielectric materials in the first and second sections 120, 122 provide a medium for transferring the RF power from the RF antenna to a plasma inside the chamber 102. In one embodiment, the dielectric material used to form the first and second sections 120, 122 is a high purity ceramic material that is chemically resistant to the process gases and that has good thermal properties. For example, in some embodiments, the dielectric material is 99.6% $Al_2O_3$ or AlN. In other embodiments, the dielectric material is Yittria and YAG.

A lid 124 of the chamber top 118 is formed of a conductive material that extends a length across the second section 122 in the horizontal direction. In many embodiments, the conductivity of the material used to form the lid 124 is high enough to dissipate the heat load and to minimize charging effects that results from secondary electron emission. Typically, the conductive material used to form the lid 124 is chemically resistant to the process gases. In some embodiments, the conductive material is aluminum or silicon.

The lid 124 can be coupled to the second section 122 with a halogen-resistant O-ring made of fluoro-carbon polymer, such as an O-ring formed of Chemrz and/or Kalrex materials. The lid 124 is typically mounted to the second section 122 in a manner that minimizes compression on the second section 122, but that provides enough compression to seal the lid 124 to the second section. In some operating modes, the lid 124 is RF and DC grounded as shown in FIG. 1.

In some embodiments, the chamber 102 includes a liner 125 that is positioned to prevent or greatly reduce metal contamination by providing line-of-site shielding of the inside of the plasma chamber 102 from metal sputtered by ions in the plasma striking the inside metal walls of the plasma chamber 102. Such liners are described in U.S. patent application Ser. No. 11/623,739, filed Jan. 16, 2007, entitled "Plasma Source with Liner for Reducing Metal Contamination," which is assigned to the present assignee. The entire specification of U.S. patent application Ser. No. 11/623,739 is incorporated herein by reference.

In various embodiments, the liner is a one-piece or unitary plasma chamber liner, or a segmented plasma chamber liner. In many embodiments, the plasma chamber liner 125 is formed of a metal base material, such as aluminum. In these embodiments, at least the inner surface 125' of the plasma chamber liner 125 includes a hard coating material that prevents sputtering of the plasma chamber liner base material.

Some plasma processes, such as plasma doping processes, generate a considerable amount of non-uniformly distributed heat on the inner surfaces of the plasma source 101 because of secondary electron emissions. In some embodiments, the plasma chamber liner 125 is a temperature controlled plasma chamber liner 125. In addition, in some embodiments, the lid 124 comprises a cooling system that regulates the temperature of the lid 124 and surrounding area in order to dissipate the heat load generated during processing. The cooling system can be a fluid cooling system that includes cooling passages in the lid 124 that circulate a liquid coolant from a coolant source.

A RF antenna is positioned proximate to at least one of the first section 120 and the second section 122 of the chamber top 118. The plasma source 101 in FIG. 1 illustrates two separate RF antennas that are electrically isolated from one another. However, in other embodiments, the two separate RF antennas are electrically connected. In the embodiment shown in FIG. 1, a planar coil RF antenna 126 (sometimes called a planar antenna or a horizontal antenna) having a plurality of turns is positioned adjacent to the first section 120 of the chamber top 118. In addition, a helical coil RF antenna 128 (sometimes called a helical antenna or a vertical antenna) having a plurality of turns surrounds the second section 122 of the chamber top 118.

In some embodiments, at least one of the planar coil RF antenna 126 and the helical coil RF antenna 128 is terminated with a capacitor 129 that reduces the effective antenna coil voltage. The term "effective antenna coil voltage" is defined herein to mean the voltage drop across the RF antennas 126, 128. In other words, the effective coil voltage is the voltage "seen by the ions" or equivalently the voltage experienced by the ions in the plasma.

Also, in some embodiments, at least one of the planar coil RF antenna 126 and the helical coil RF antenna 128 includes a dielectric layer 134 that has a relatively low dielectric constant compared to the dielectric constant of the $Al_2O_3$ dielectric window material. The relatively low dielectric constant dielectric layer 134 effectively forms a capacitive voltage divider that also reduces the effective antenna coil voltage. In addition, in some embodiments, at least one of the planar coil RF antenna 126 and the helical coil RF antenna 128 includes a Faraday shield 136 that also reduces the effective antenna coil voltage.

A RF source 130, such as a RF power supply, is electrically connected to at least one of the planar coil RF antenna 126 and helical coil RF antenna 128. In many embodiments, the RF source 130 is coupled to the RF antennas 126, 128 by an impedance matching network 132 that matches the output impedance of the RF source 130 to the impedance of the RF antennas 126, 128 in order to maximize the power transferred from the RF source 130 to the RF antennas 126, 128. Dashed lines from the output of the impedance matching network 132 to the planar coil RF antenna 126 and the helical coil RF antenna 128 are shown to indicate that electrical connections can be made from the output of the impedance matching network 132 to either or both of the planar coil RF antenna 126 and the helical coil RF antenna 128.

In some embodiments, at least one of the planar coil RF antenna 126 and the helical coil RF antenna 128 is formed such that it can be liquid cooled. Cooling at least one of the planar coil RF antenna 126 and the helical coil RF antenna 128 will reduce temperature gradients caused by the RF power propagating in the RF antennas 126, 128.

In some embodiments, the plasma source 101 includes a plasma igniter 138. Numerous types of plasma igniters can be used with the plasma source 101. In one embodiment, the plasma igniter 138 includes a reservoir 140 of strike gas, which is a highly-ionizable gas, such as argon (Ar), which assists in igniting the plasma. The reservoir 140 is coupled to the plasma chamber 102 with a high conductance gas connection. A burst valve 142 isolates the reservoir 140 from the process chamber 102. In another embodiment, a strike gas source is plumbed directly to the burst valve 142 using a low conductance gas connection. In some embodiments, a portion of the reservoir 140 is separated by a limited conductance orifice or metering valve that provides a steady flow rate of strike gas after the initial high-flow-rate burst.

A platen 144 is positioned in the process chamber 102 a height below the top section 118 of the plasma source 101. The platen 144 holds a substrate 146 for plasma processing. In many embodiments, the substrate 146 is electrically connected to the platen 144. In the embodiment shown in FIG. 1, the platen 144 is parallel to the plasma source 101. However, in one embodiment of the present invention, the platen 144 is tilted with respect to the plasma source 101 to achieve various process goals.

A platen 144 is used to support a substrate 146 or other workpieces for processing. In some embodiments, the platen 144 is mechanically coupled to a movable stage that translates, scans, or oscillates the substrate 146 in at least one direction. In one embodiment, the movable stage is a dither generator or an oscillator that dithers or oscillates the substrate 146. The translation, dithering, and/or oscillation motions can reduce or eliminate shadowing effects and can improve the uniformity of the ion beam flux impacting the surface of the substrate 146.

A bias voltage power supply 148 is electrically connected to the platen 144. The bias voltage power supply 148 is used to bias the platen 144 and the substrate 146 so that ions in the plasma are extracted from the plasma and impact the substrate 146. In various embodiments, the ions can be dopant ions for plasma doping or inert or reactive ions for etching and deposition. In various embodiments, the bias voltage power supply 148 is a DC power supply, a pulsed power supply, or a RF power supply. In one embodiment of the plasma processing apparatus according the present invention, the bias voltage power supply 148 has an output waveform that is independent of the output waveform of the RF source 130 that powers at least one of the planar coil RF antenna 126 and helical coil RF antenna 128. In another embodiment of the plasma processing apparatus according the present invention, the bias voltage power supply 148 has an output waveform that is synchronized to the output waveform of the RF source 130 that powers at least one of the planar coil RF antenna 126 and helical coil RF antenna 128. The bias voltage power supply 148 and the RF source 130 can physically be the same power supply with two different outputs or can be separate power supplies.

A controller 152 is used to control the RF power supply 130 and the bias voltage power supply 148 to generate a plasma and to bias the substrate 146 so as to at least partially neutralize charge accumulation during plasma processing according to the present invention. The controller 152 can be part of the power supplies 130, 148 or can be a separate controller that is electrically connected to control inputs of the power supplies 130, 148. The controller 152 controls the RF power supply 130 so that pulses are applied to either or both of the planar coil RF antenna 126 and the helical coil RF antenna 128 with at least two different amplitudes. Also, the controller 152 controls the RF power supply 130 and the bias voltage power supply 148 so that the pulses are applied to at least one of the planar coil RF antenna 126 and the helical coil RF antenna 128, and also to the substrate 146 at relative times that at least partially neutralize charge accumulation during plasma processing according to the present invention.

One skilled in the art will appreciate that there are many different possible variations of the plasma source 101 that can be used with the features of the present invention. See, for example, the descriptions of the plasma sources in U.S. patent application Ser. No. 10/908,009, filed Apr. 25, 2005, entitled "Tilted Plasma Doping." Also see the descriptions of the plasma sources in U.S. patent application Ser. No. 11/163,303, filed Oct. 13, 2005, entitled "Conformal Doping Apparatus and Method." Also see the descriptions of the plasma sources in U.S. patent application Ser. No. 11/163,307, filed Oct. 13, 2005, entitled "Conformal Doping Apparatus and Method." In addition, see the descriptions of the plasma sources in U.S. patent application Ser. No. 11/566,418, filed Dec. 4, 2006, entitled "Plasma Doping with Electronically Controllable implant Angle." The entire specification of U.S. patent application Ser. Nos. 10/908,009, 11/163,303, 11/163,307 and 11/566,418 are herein incorporated by reference.

In operation, the controller 152 instructs the RF source 130 to generate RF currents that propagate in at least one of the RF antennas 126 and 128. That is, at least one of the planar coil RF antenna 126 and the helical coil RF antenna 128 is an active antenna. The term "active antenna" is herein defined as an antenna that is driven directly by a power supply. In many embodiments of the plasma processing apparatus of the present invention, the RF source 130 operates in a pulsed mode. However, the RF source 130 can also operate in the continuous mode.

In some embodiments, one of the planar coil antenna 126 and the helical coil antenna 128 is a parasitic antenna. The term "parasitic antenna" is defined herein to mean an antenna that is in electromagnetic communication with an active antenna, but that is not directly connected to a power supply. In other words, a parasitic antenna is not directly excited by a power supply, but rather is excited by an active antenna in close proximity, which in the apparatus shown in FIG. 1A is one of the planar coil antenna 126 and the helical coil antenna 128 powered by the RF source 130. In some embodiments of the invention, one end of the parasitic antenna is electrically connected to ground potential in order to provide antenna tuning capabilities. In this embodiment, the parasitic antenna includes a coil adjuster 150 that is used to change the effective number of turns in the parasitic antenna coil. Numerous different types of coil adjusters, such as a metal short, can be used.

The RF currents in the RF antennas 126, 128 then induce RF currents into the chamber 102. The RF currents in the chamber 102 excite and ionize the process gas so as to generate a plasma in the chamber 102. The plasma chamber liner 125 shields metal sputtered by ions in the plasma from reaching the substrate 146.

The controller 152 also instructs the bias voltage power supply 148 to bias the substrate 146 with negative voltage pulses that attract ions in the plasma towards the substrate 146. During the negative voltage pulses, the electric field within the plasma sheath accelerates ions toward the substrate 146 for plasma processing. For example, the electric field within the plasma sheath can accelerate ions toward the substrate 146 to implant the ions into the surface of the substrate 146, to etch the surface of the substrate 146, to produce a chemical reaction on the surface of the substrate 146 for either etching or deposition, or to grow a thin film on the surface of the substrate 146. In some embodiments, a grid is used to extract ions in the plasma towards the substrate 146 in order to increase the energy of the ions.

Figure 1B:
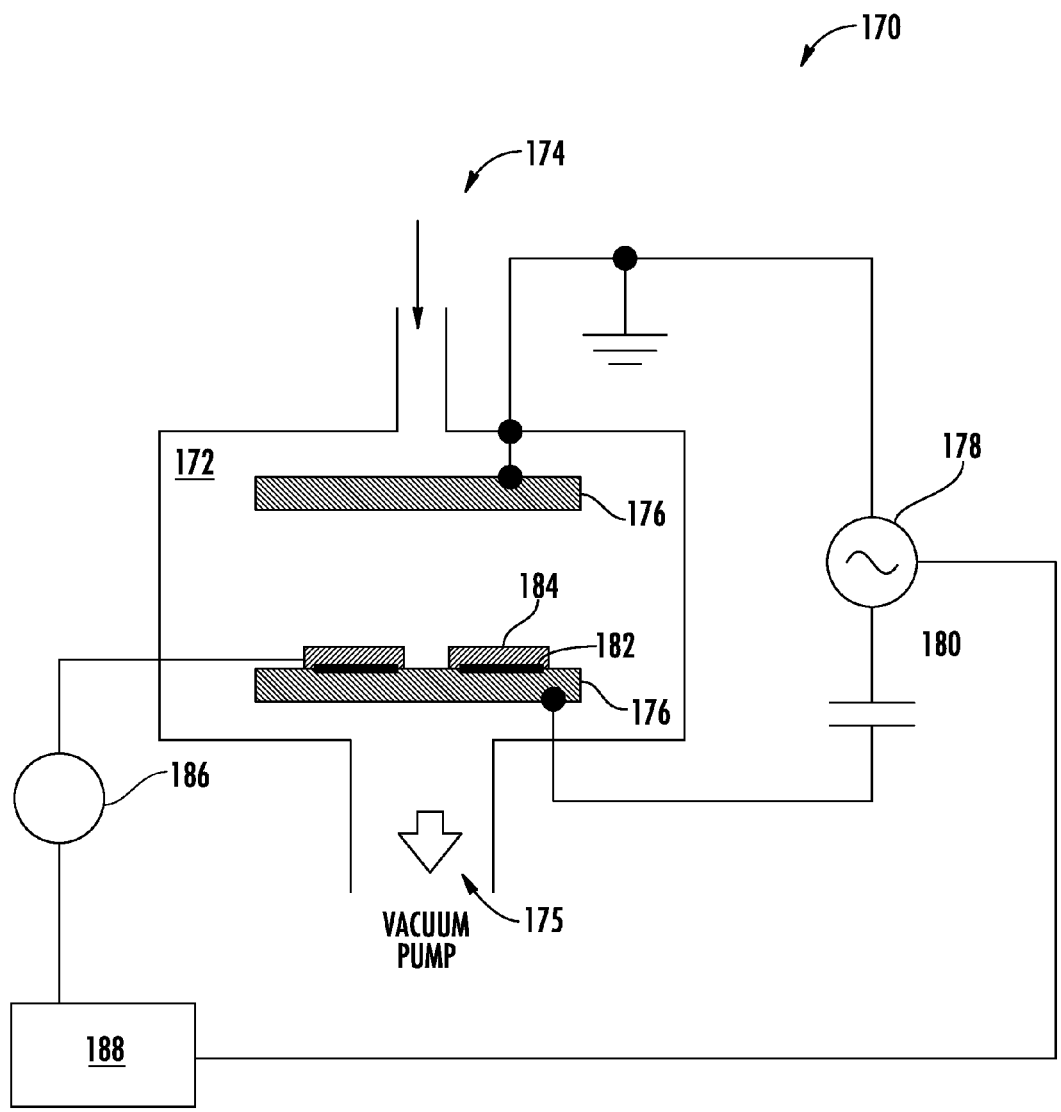
FIG. 1B illustrates another exemplary plasma processing system according to another embodiment of the present disclosure.

FIG. 1B illustrates another embodiment of a plasma processing system 170 with charge neutralization according to the present invention. The plasma processing system 170 is a capacitive RF discharge system. Capacitive RF discharge plasma processing systems are well known in the industry. The plasma processing system 170 includes a process chamber 172 having a process gas inlet 174 that receives a feed gas from a mass flow controller which flow through the plasma discharge area. The process chamber 172 also includes an exhaust port 175 that is coupled to a vacuum pump that removes effluent gases. Typically a throttle valve is positioned in the exhaust port 175 that is coupled to a vacuum pump to control the pressure in the chamber 172. Typically operating pressures are in the 10-1000 mT range.

The plasma processing system 170 includes two planar electrodes, which are often called parallel plate electrodes 176. The parallel plate electrodes 176 are driven by an RF source 178. The parallel plate electrodes 176 are separated by a gap that is in the range of 2-10 cm. A blocking capacitor 180 is electrically connected between the output of the RF source 178 and the parallel plate electrode 176. The blocking capacitor 180 is used to remove DC and low frequency signals from the drive signal. The RF drive signal is typically in the 100-1000V range. The parallel plate electrodes 176 are typically driven by 13.56 MHz signal, but other frequencies are also suitable.

In conventional capacitive RF discharge plasma processing systems, the substrate is positioned directly on the bottom parallel plate. However, the plasma processing system 170 includes an insulator 182 that is positioned between the bottom plate and the substrate 184. The insulator 182 allows the substrate 184 to be biased independently of the parallel plate electrodes 176 which are driven by the RF source 178. A separate substrate bias voltage power supply 186 is used to bias the substrate 184. An output of the substrate bias voltage power supply 186 is electrically connected to the substrate 184 that is positioned in the insulator 182.

A controller 188 is used to control the RF power supply 186 and the bias voltage power supply 186 to generate a plasma and to bias the substrate 184 so as to at least partially neutralize charge accumulation during plasma processing according to the present invention. The controller 188 can be part of the power supplies 178, 186 or can be a separate controller that is electrically connected to control inputs of the power supplies 178, 186. The controller 188 controls the RF power supply 178 so that multi-level RF pulses are applied to the parallel plate electrode 176 with at least two different amplitudes. Also, the controller 188 controls the RF power supply 178 and the bias voltage power supply 186 so that the RF pulses are applied to the parallel plate electrodes 176 at relative times that at least partially neutralize charge accumulation during plasma processing according to the present invention.

The operation of the plasma processing system 170 is similar to the operation of the plasma processing system 100. The controller 188 instructs the RF source 178 to generate RF currents that propagate to the parallel plate electrodes 176 to generate a plasma between the parallel plates from the feed gas. The controller 188 also instructs the bias voltage power supply 186 to bias the substrate 184 with negative voltage pulses that attract ions in the plasma towards the substrate 184. During the negative voltage pulses, the electric field within the plasma sheath accelerates ions toward the substrate 184 for plasma processing. For example, the electric field within the plasma sheath can accelerate ions toward the substrate 184 to implant the ions into the surface of the substrate 184, to etch the surface of the substrate 184, to produce a chemical reaction on the surface of the substrate 184 for either etching or deposition, or to grow a thin film on the surface of the substrate 184.

When the RF source 178 and the bias voltage power supply 186 are operated under some processing conditions, charge can accumulate on the substrate 184. Charge accumulation on the substrate 184 can result in the development of a relatively high potential voltage on the substrate 184 being plasma processed that can cause processing non-uniformities, arcing, and device damage. Charge accumulation on the substrate 184 can be greatly reduced by generating multi-level RF waveforms with the RF source 178 and biasing the substrate 184 according to the present invention. In addition, certain process goals, such as process rates and process profiles, can be achieved by generating multi-level RF waveforms with the RF source 178 and biasing the substrate 184 according to the present invention.

The methods and apparatus of the present invention can be applied to numerous other types of plasma processing systems. For example, the methods and apparatus of the present invention can be applied to ECR plasma processing systems, helicon plasma processing systems, and helicon resonator plasma processing systems. In each of these systems, the RF source generates a multi-amplitude pulsed RF waveform that has at least two RF power levels. Also, in many embodiments, the substrate is biased by a bias voltage power supply that generates a bias voltage waveform that can be synchronized to the RF waveform driving the plasma source with a controller.

Figure 2A:
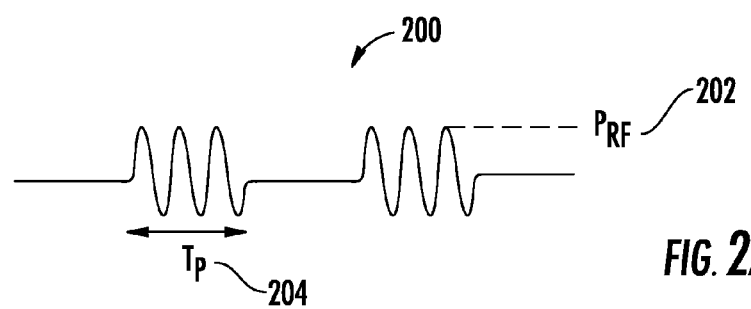
FIG. 2A illustrates a prior art waveform generated by the RF source having a single amplitude.

Referring to FIG. 2A, there is shown a conventional waveform 200 generated by the RF source 130 having a single amplitude that can cause charge accumulation on the substrate 146 (FIG. 1) under some conditions. The waveform 200 is at ground potential until the plasma is generated with a pulse having a power level $P_{RF}$ 202. The power level $P_{RF}$ 202 is chosen to be suitable for plasma doping and many plasma etching and plasma deposition processes. The pulse terminates after the pulse period $T_P$ 204 and then returns to ground potential. The waveform then periodically repeats.

Figure 2B:
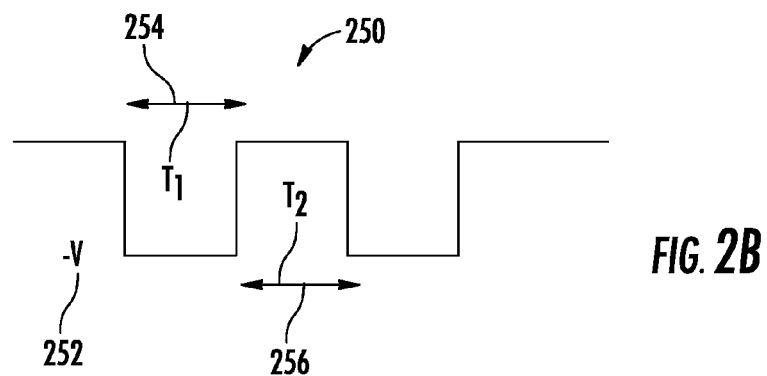
FIG. 2B illustrates a prior art waveform generated by the bias voltage supply.

Referring to FIG. 2B, there is shown a conventional waveform 250 generated by the bias voltage supply 148 that applies a negative voltage 252 to the substrate 146 (FIG. 1) during plasma processing to attract ions in the plasma. The negative voltage 252 is applied during the period $T_1$ 254 when the waveform 200 generated by the RF source 130 has a power equal to the power level $P_{RF}$ 202. The negative voltage 252 attracts ions in the plasma to the substrate 146 for plasma processing. The waveform 200 is at ground potential during the period $T_2$ 256 when the plasma processing is terminated. At relatively high duty cycles (i.e. greater than about 25% and in some cases greater than about 2%), charge tends to accumulate on the substrate 146 during the pulse period $T_1$ 254 when the waveform 250 generated by the RF source 130 has a power equal to the power level $P_{RF}$ 202.

The methods and apparatus of the present invention allow plasma processing, such as plasma doping, plasma etching, and plasma deposition, to be performed at higher duty cycles by reducing the probability of damage caused by charging effects. There are numerous methods according to the present invention to power the plasma source 101 and to bias the substrate 146 being processed to at least partially neutralize charge accumulation on the substrate 146.

Figure 3A:
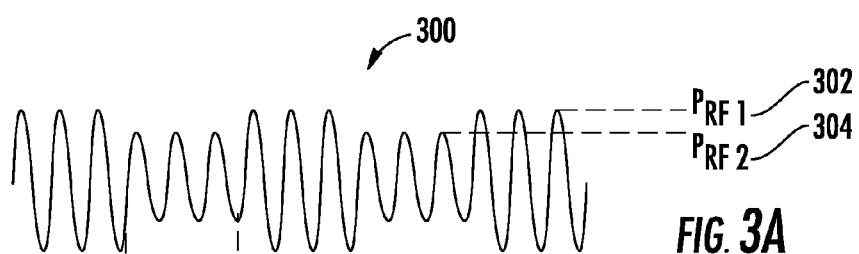
FIG. 3A illustrates a RF power waveform generated by the RF source according one embodiment of the present disclosure.

Referring to FIG. 3A there is shown a RF power waveform 300 generated by the RF source 130 (FIG. 1) according to the present invention that has multiple amplitudes for at least partially neutralizing charge accumulation on the substrate 146 (FIG. 1). The waveform 300 is pulsed and has a first 302 and a second power level 304, which are indicated in the figure as $P_{RF1}$ and $P_{RF2}$, respectively. However, it should be understood that waveforms with more than two amplitudes can be used in the methods of the present invention to at least partially neutralize charge accumulation on the substrate 146. It should also be understood that the waveforms may or may not have discrete amplitudes. For example, the waveforms can be continuously changing. That is, in some embodiments, the waveforms can ramp with positive or negative slopes. Also, the waveforms can ramp in a linear or in a non-linear rate.

The first power level $P_{RF1}$ 302 is chosen to provide enough RF power to at least partially neutralize charge accumulation on the substrate 146 when the substrate 146 is not biased for plasma processing. The second power level $P_{RF2}$ 304 is chosen to be suitable for plasma processing, such as plasma doping, plasma etching, and plasma deposition. In various embodiments, the waveform 300 generated by the RF source 130 including the first and second power levels $P_{RF1}$ 302, $P_{RF2}$ 304 is applied to one or both of the planar coil RF antenna 126 and the helical coil RF antenna 128 (see FIG. 1). In one specific embodiment, the waveform 300 generated by the RF source 130 is applied to one of the planar coil RF antenna 126 and the helical coil RF antenna 128 when it is at the first power level $P_{RF1}$ 302 and is applied to the other of the planar coil RF antenna 126 and the helical coil RF antenna 128 when it is at the second power levels $P_{RF2}$ 304. In another specific embodiment, the waveform 300 generated by the RF source 130 is applied to one of the planar coil RF antenna 126 and the helical coil RF antenna 128 when it has a first frequency and is applied to the other of the planar coil RF antenna 126 and the helical coil RF antenna 128 when it has a second frequency that is different from the first frequency as described in connection with FIGS. 5A-5C.

The waveform 300 shown in FIG. 3A indicates that the first power level $P_{RF1}$ 302 is greater than the second power level $P_{RF2}$ 304. However, in other embodiments, the first power level $P_{RF1}$ 302 is less than the second power level $P_{RF2}$ 304. Also, in some embodiments, the waveform 300 includes a third power level that is zero or some relatively low power level when the substrate 146 is not biased for plasma processing as described in connection with FIG. 6.

The waveform 300 also indicates a first pulse period $p_{P1}$ 306 corresponding to the time period were the waveform 300 has a power equal to the first power level $P_{RF1}$ 302 and a second pulse period $T_{P2}$ 308 corresponding to the time period were the waveform has a power equal to the second power level $P_{RF2}$ 304. The total multi-amplitude pulse period for the waveform 300 $T_{Total}$ 310 is the combination of the first pulse period $T_{P1}$ 306 and the second pulse period $TP_2$ 308. For example, in one embodiment, the first and second pulse periods $TP_1$ 306, $TP_2$ 308 are both in the range of 30-500 μs and the total pulse period $T_{Total}$ 310 is in the range of 60 μs-1 ms. In other embodiments, the total pulse period $T_{Total}$ 310 can be on order of 1 ms or greater.

FIG. 3A indicates that the frequency of the waveform 300 during the first pulse period $T_{P1}$ 306 is the same as the frequency of the waveform 300 during the second pulse period $T_{P2}$ 308. However, it should be understood that in various embodiments, the frequency of the waveform 300 during the first pulse period $T_{P1}$ 306 can be different from the frequency of the waveform 300 during the second pulse period $T_{P2}$ 308 as described in connection with FIGS. 5A-5C. In addition, the frequency of the waveform 300 can be changed within at least one of the first and the second pulse periods $T_{P1}$, 306, $T_{P2}$, 308.

Thus, in some embodiments, the waveform 300 includes both multiple frequencies and multiple amplitudes that are chosen to at least partially neutralize charge accumulation during plasma processing. In addition, in some embodiments, the waveform 300 includes both multiple frequencies and multiple amplitudes that are chosen to improve certain process parameters, such as the retained dose for plasma doping. Furthermore, in some embodiments, the waveform 300 includes both multiple frequencies and multiple amplitudes that are chosen to assist in achieving certain process goals. For example, the waveform 300 can include both multiple frequencies and multiple amplitudes to improve process control and to increase process rates.

Also, the waveform 300 can include both multiple frequencies and multiple amplitudes to achieve knock-on ion implants to form retrograde doping profiles. Also, the waveform 300 can include both multiple frequencies and multiple amplitudes to achieve certain etching profiles and etching process goals, such as achieving high aspect-ratio etching profiles. In addition, the waveform 300 can include both multiple frequencies and multiple amplitudes to achieve certain deposition profiles and process goals, such as depositing material into high aspect-ratio structures, depositing conformal or near conformal coating, and filling gaps in trenches and other device structures.

Figure 3B:
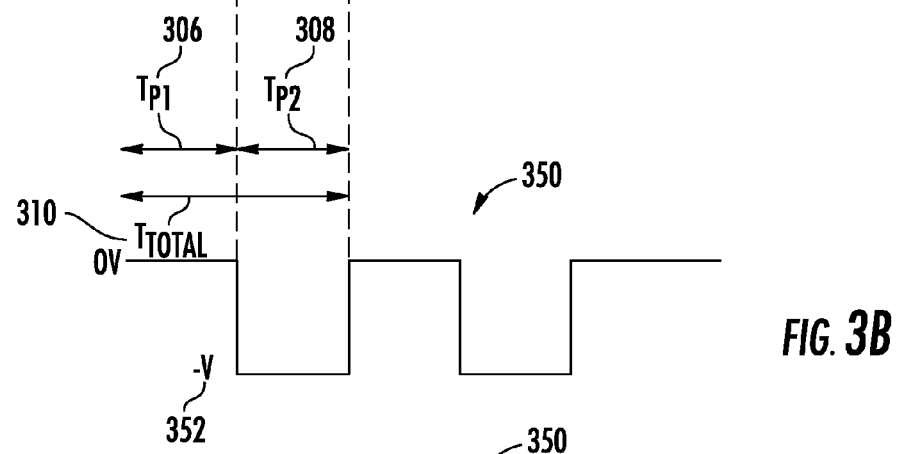
FIG. 3B illustrates a bias voltage waveform generated by the bias voltage supply according another embodiment of the present disclosure.

Referring to FIG. 3B there is shown a bias voltage waveform 350 generated by the bias voltage supply 148 (FIG. 1) according to the present invention that applies a negative voltage 352 to the substrate 146 during plasma processing to attract ions. The bias voltage waveform 350 is synchronized with the RF power waveform 300. However, it should be understood that the pulses in the bias voltage waveform 350 are not necessarily aligned with the pulses in the RF power waveform 300. The negative voltage 352 is applied during the second pulse period $T_{P2}$ 308 when the waveform 350 generated by the RF source 130 has a power equal to the second power level $P_{RF2}$ 304. The waveform 350 is at ground potential during the first pulse period $T_{P1}$ 306 when the plasma processing is terminated and the waveform 300 has a power equal to the first power level $P_{RF1}$ 302.

Applying a waveform to the plasma source 101 (FIG. 1) with two different power levels where the first power level $P_{RF1}$ 302 is applied by the RF source 130 during the period $T_{P1}$ 306 when the waveform 350 generated by the bias voltage supply 148 (FIG. 1) is at ground potential will assist in neutralizing charge accumulated on the substrate 146 (FIG. 1). Electrons in the corresponding plasma will neutralize at least some of the charge accumulated on the substrate 146.

Figure 3C:
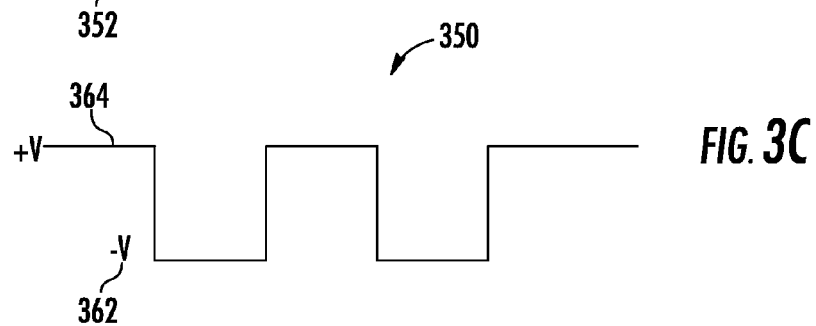
FIG. 3C illustrates another bias voltage waveform generated by the bias voltage supply according another embodiment of the present disclosure.

FIG. 3C illustrates a waveform 360 generated by the bias voltage supply 148 (FIG. 1) according to the present invention that applies a negative voltage 362 to the substrate 146 during plasma processing to attract ions and that applies a positive voltage 364 to the substrate 146 after plasma processing is terminated to assist in neutralizing charge on the substrate 146. The negative voltage 362 is applied during the second pulse period $T_{P2}$ 308 when the waveform 300 generated by the RF source 130 has a power equal to the second power level $P_{RF2}$ 304. The waveform 360 is at a positive potential 364 during the first pulse period $T_{P1}$ 306 when the waveform 300 generated by the RF source 130 has a power equal to the first power level $P_{RF1}$ 302.

Applying a waveform to the plasma source 101 (FIG. 1) with two different power levels where the first power level $P_{RF1}$ 302 is applied by the RF source 130 (FIG. 1) during the first period $T_{P1}$ 306 when the waveform 360 generated by the bias voltage supply 148 (FIG. 1) is at a positive potential 364 will assist in neutralizing charge accumulated on the substrate 146 (FIG. 1). Electrons in the corresponding plasma will neutralize at least some of the charge accumulated on the substrate 146. In addition, the positive voltage 364 applied the substrate 146 will also neutralize at least some of the charge accumulated on the substrate 146.

Figure 4A:
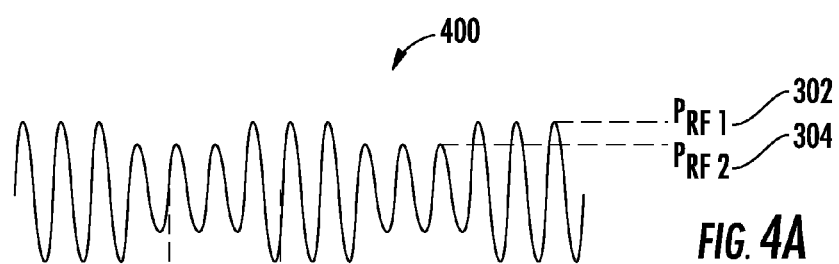
FIGS. 4A-C illustrate a RF power waveform generated by the RF source and bias voltage waveforms generated by the bias voltage supply according to another embodiment of the present disclosure.
Figure 4B:
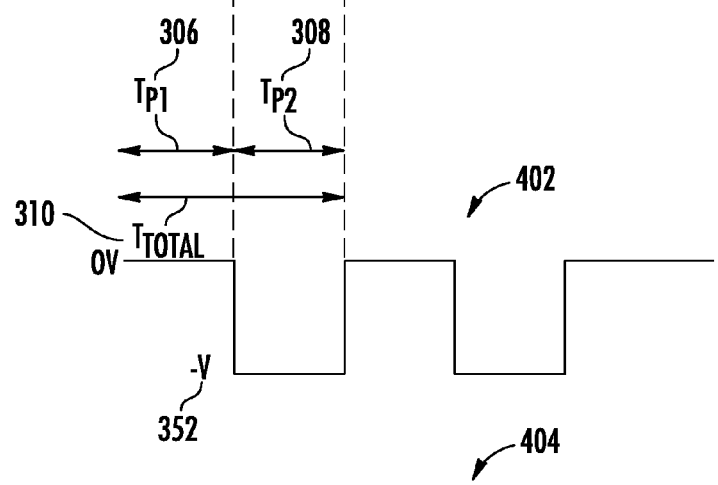
Figure 4C:
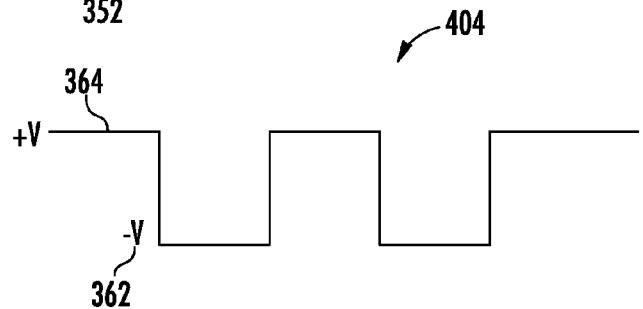

FIGS. 4A-C illustrate a RF power waveform 400 generated by the RF source 130 (FIG. 1) and bias voltage waveforms 402, 404 generated by the bias voltage supply 148 (FIG. 1) according to the present invention that are similar to the waveforms 300, 350, and 360 described in connection with FIGS. 3A-3C, but that are displaced in time relative to the waveforms 300, 350, and 360 so as to perform plasma process with both the first and the second power levels $P_{RF1}$ 302, $P_{RF2}$ 304. In this embodiment, the RF power waveform 400 and the bias voltage waveforms 402, 404 are synchronized, but the pulses in the RF power waveform 400 are not aligned with the pulses in the bias voltage waveforms 402, 404.

Changing the power generated by the RF source 130 during plasma processing allows the user to more precisely control the amount of charge that is accumulating on the surface of the substrate 146 during plasma processing to achieve certain process goals and effects. For example, increasing the power near the end of the second pulse period $T_{P2}$ 308 will enhance the neutralization of charge accumulated on the substrate 146.

Referring to FIGS. 5A-C there are shown a RF power waveform 500 generated by the RF source 130 (FIG. 1) with a variable frequency and corresponding bias voltage waveforms 502, 504 generated by the bias voltage supply 148 (FIG. 1) according to another embodiment of the present invention. The waveform 500 is similar to the waveforms 300, 400 described in connection with FIGS. 3 and 4. However, the RF powers in the first and second pulse periods $T_{P1}$ 306, $T_{P2}$ 308 are the same and the frequencies in the first and second pulse periods $T_1$ 306, $T_{P2}$ 308 are different. Changing the frequency of the waveform 500 changes the ion/electron density and, therefore, changes the charge neutralization efficiency.

Thus, in one embodiment, the frequency of the waveform 500 in the first pulse period $T_{P1}$ 306 is different from the frequency of the waveform 500 in the second pulse period $T_{P2}$ 308 and these frequencies are chosen to at least partially neutralize charge accumulation during plasma processing. The waveforms 502, 504 are similar to the waveforms 350 and 360 that were described in connection with FIG. 3. In other embodiments, the waveforms 502, 504 are displaced in time relative to the waveform 500, similar to the displacement of waveforms 402, 404 that were described in connection with FIG. 4.

In addition, in one aspect of the present invention, parameters, such as the multiple power levels generated by the RF source 130, the frequency of the waveform 500 in the first and second pulse periods $T_{P1}$ 306, $T_{P2}$ 308, and the relative timing of the waveform 500 with respect to the waveforms generated by the bias voltage supply 148 (FIG. 1), are chosen to achieve certain process goals. For example, generating multiple power levels with the RF source 130 where one power level is generated by the RF source 130 when the bias voltage is at ground potential allows the user to use less power during plasma processing and/or to reduce process times because some plasma processing will occur when the bias voltage is at ground potential.

Also, in one embodiment of the present invention, at least one of the multiple power levels generated by the RF source 130 (FIG. 1), the frequency of the waveform 500 in at least one of the first and second pulse periods $T_{P1}$ 306, $T_{P2}$ 308, and the relative timing of the waveform 500 with respect to the waveforms generated by the bias voltage supply 148 (FIG. 1) are chosen to improve the retained dose on the substrate 146 (FIG. 1) when performing plasma doping. For example, using less power during plasma processing will result in less deposition and, therefore, a higher retained dose in the substrate. The operating pressure, gas flow rates, type of dilution gas, and plasma source power can also be selected to further improve the retained dose with this method.

Also, in another embodiment of the present invention, at least one of the multiple power levels generated by the RF source 130 (FIG. 1), the frequency of the waveform 500 in at least one of the first and second pulse periods $T_{P1}$ 306, $T_{P2}$ 308, and the relative timing of the waveform 500 with respect to the waveforms generated by the bias voltage supply 148 are chosen to improve sidewall coverage during plasma processing. The term "improve sidewall coverage" is referred to herein as increasing the ratio of the deposition rate of material on the sidewall to the deposition rate of material on the surface of the surface of the substrate perpendicular to the ion flux. Achieving better sidewall coverage is important for many applications, such as conformal doping and conformal deposition applications. For example, many three-dimensional and other state-of-the-art devices required conformal doping and conformal deposition.

Also, in another embodiment of the present invention, waveforms are generated by the RF source 130 (FIG. 1) with certain multiple power levels, multiple frequencies, and relative timings with respect to the waveforms generated by the bias voltage supply 148 (FIG. 1) so as to create knock-on ion implants for plasma doping. The term "knock-on ion implant" is defined herein as a recoil ion implant where an ion is implanted through the surface layers of the substrate 146 to drive the dopant material into the substrate 146.

The ions used for the knock-on ion implant can be an inert ion species, such as He, Ne, Ar, Kr and Xe, which can be formed from an inert feed gas. In some embodiments, the mass of the knock-on ions is chosen to be similar to a mass of the desired dopant ions. The RF source 130 (FIG. 1) generates a RF power that is sufficient to direct the knock-on ions toward the substrate 146 (FIG. 1) with enough energy to physically knock the deposited dopant material into both the planar and non-planar features of the substrate 146 (FIG. 1) upon impact. Also, the operating parameters, such as chamber pressure, gas flow rate, plasma source power, gas dilution, and duty cycle of pulsed bias supply, can be chosen to enhance knock-on ion implants.

Knock-on ion implant can be used to form retrograde doping profiles. The waveforms are generated by the RF source 130 (FIG. 1) with certain multiple power levels, multiple frequencies, and relative timings with respect to the waveforms generated by the bias voltage supply 148 so as to create a retrograde profile, such as a retrograde doping profile or a retrograde deposited film profile. The term "retrograde profile" is defined herein as a profile where the peak concentration of the profile is below the surface of the substrate. See, for example, U.S. patent application Ser. No. 12/044,619, entitled "A Method of Forming a Retrograde Material Profile Using Ion Implantation, which is assigned the present assignee. The entire specification of U.S. patent application Ser. No. 12/044,619 is incorporated herein by reference.

For plasma doping, it is sometimes desirable to form retrograde ion implant dopant profiles because it is difficult to precisely control the depth of ion implanted layers for many reasons. For example, during plasma doping, there could be some unintentional etching of the surface of the substrate caused by physical sputtering and chemical etching. In addition, there could be some unintentional deposition on the surface of the substrate. Furthermore, there can be a significant ion implant energy distribution due to many factors, such as the presence of multiple ion species, collisions between ions, non uniformities in the plasma sheath, presence of secondary electron emissions, displacements currents formed due to parasitic impedances, and the application of non-ideal bias pulses.

In addition, it is sometimes desirable to form retrograde ion implant dopant profiles because surface-peak dopant profiles are very sensitive to post deposition or post implant processes since most of the maximum peak concentration of deposited or implanted material is located at or near the surface of the substrate. In particular, the photo-resist strip process typically performed after implantation will remove a significant amount of dopant material near the surface.

In other embodiments, the waveforms are generated by the RF source 130 with certain multiple power levels, multiple frequencies, and relative timings with respect to the waveforms generated by the bias voltage supply 148 so as to achieve certain process goals or process profiles, such as etching profiles. For example, the multiple power levels, multiple frequencies, and relative timings with respect to the waveforms generated by the bias voltage supply 148 can be chosen to achieve high aspect-ratio etching profiles or certain types of deposition profiles.

One skilled in the art will appreciate that waveforms generated by the RF source 130 (FIG. 1) according to the present invention can have both multiple amplitudes and multiple frequencies and can have various relative timings with respect to the waveforms generated by the bias voltage supply 148 (FIG. 1). In fact, there are an almost infinite number of possible waveforms with multiple power levels and multiple frequencies that can be generated by the RF source 130 (FIG. 1) and relative timing with respect to the waveforms generated by the bias voltage supply 148 (FIG. 1) that will at least partially neutralize charge and/or achieve the process goals described herein.

Figure 6:
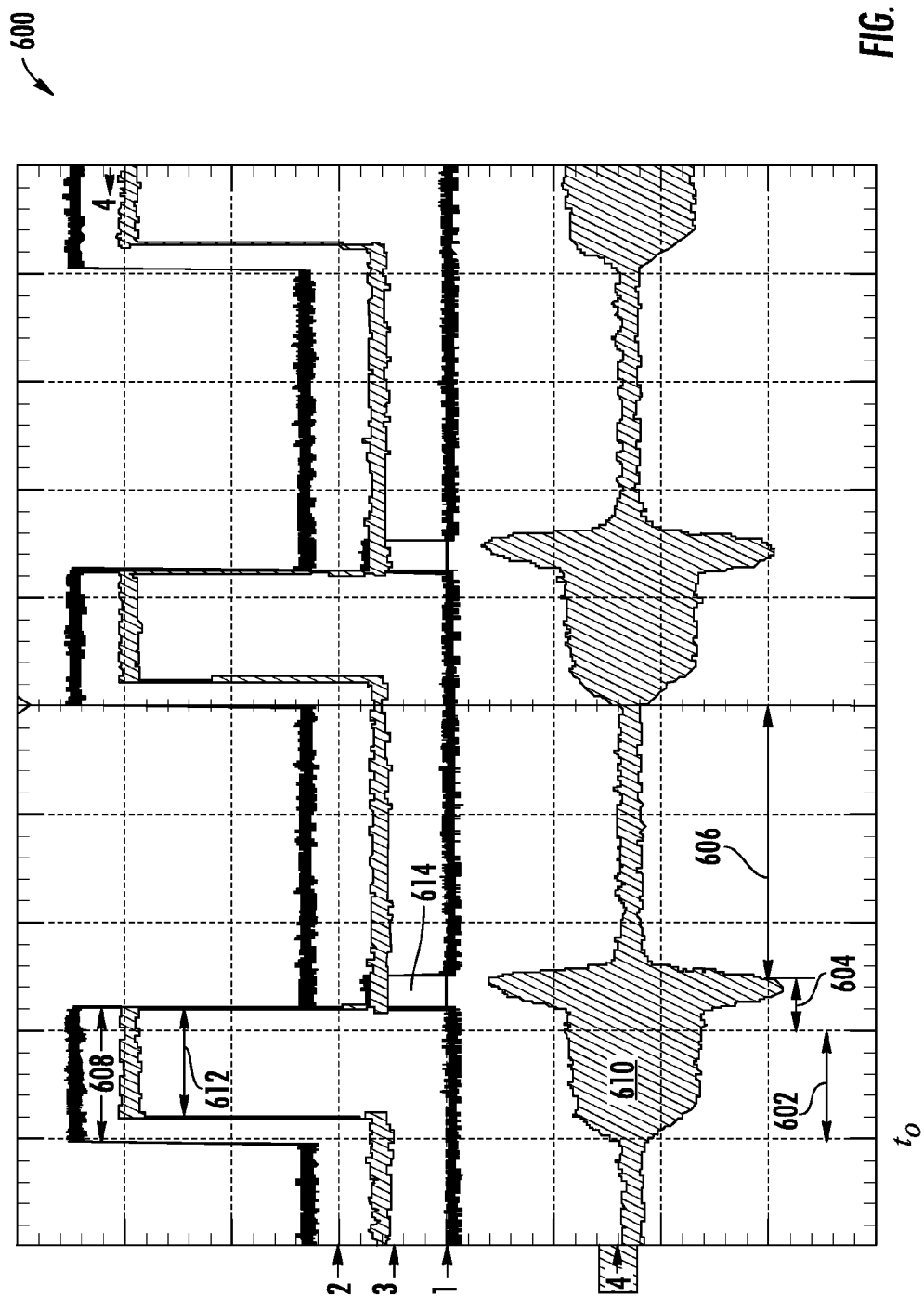
FIG. 6 illustrates a multi-set-point RF power and control signal waveforms according to another embodiments of the present disclosure.

Referring to FIG. 6 there is shown measured multi-set-point RF power and control signal waveforms 600 according to one embodiment of the present invention. The waveforms 600 include RF power and control signal waveforms as a function of time beginning at time $t_0$. The waveforms 600 show an ion implantation period 602, a charge neutralization period 604, and a power off period 606.

Referring to FIGS. 1 and 6, at time $t_0$, the controller 152 (FIG. 1) generates an implant pulse 608 that instructs the bias voltage power supply 148 (FIG. 1) to bias the substrate 146 (FIG. 1) with a negative voltage pulse that attracts ions in the plasma towards the substrate 146. The rise time of the implant pulse 602 is about 30 microseconds. Also, at time $t_0$ the controller 152 generates a RF pulse control signal that initiates a RF power waveform 610 having a first power level. In the ion implantation period 602, the controller 152 generates a first RF pulse control signal 612 that causes RF currents to flow in at least one of the RF antennas 126 and 128 (FIG. 1) thereby striking a plasma. The rise time of the first RF pulse control signal 612 is about 30 microseconds.

The charge neutralization period 604 begins when the first RF pulse control signal 612 and the implant pulse signal 608 both return to zero. The fall time of the first RF pulse control signal and the implant pulse control signal is about 20 microseconds. In the charge neutralization period 604, the controller 152 generates a second RF pulse control signal 614 that ramps the RF power waveform 610 to a second power level. In many embodiments, the second power level is greater than the first power level as shown in FIG. 6. However, in other embodiments, the second power level can be any power level including a power level that is lower than the first power level. The rise time of the second RF pulse control signal is also about 30 microseconds. In the charge neutralization period 604, at least some of the charge on the substrate 146 is efficiently neutralized by electrons in the plasma. This partial or complete charge neutralization reduces undesirable charging effects on the substrate 146.

The power off period 606 begins when the second RF pulse control signal 614 returns to zero. The fall time of the second RF pulse control signal 614 is about 20 microseconds. In the power off period 606, the RF power is extinguished, which terminates the plasma. The methods of plasma processing with enhanced charge neutralization according to the present invention can be employed with many different multi-setpoint RF power and control signal waveforms 600.

It should be understood that the methods for charge neutralization according to the present invention can be used with numerous other types of plasma processing apparatus. For example, the methods for charge neutralization can be used with plasma processing apparatus that have inductively coupled plasma (ICP) sources, helicon resonator plasma sources, microwave plasma sources, ECR plasma source, and capacitive coupled plasma sources. In fact, any type of plasma source that can be operated in a pulsed mode can be used to perform the methods of the present disclosure.

When pulsed RF and bias waveforms 200 and 250 are used for implanting ions, it is difficult to accurately control the composition of the ions that will be implanted. For example, a mixture of $B_2H_6$ and helium may be used to create a plasma. This mixture may create ions of p-type dopant, as well as helium ions. When the substrate is negatively biased, positive ions created in the plasma are accelerated toward the substrate. The helium ions may cause more damage in the substrate and slow down the regrowth rate of the substrate during the anneal process. Therefore, it would be beneficial to minimize the creation of helium ions. However, in traditional plasma immersion implantation, ions are indiscriminately created, therefore both dopant and helium ions are implanted.

Hereinafter, various embodiments of plasma processing are disclosed. As noted above, the process may be plasma based ion implantation process, plasma based etching process, plasma based deposition process, or any other plasma based process. For purpose of clarity and simplicity, the description may focus on RF waveform applied to the plasma source to generate and maintain plasma and bias waveform applied to the substrate to process the substrate with the plasma or particles contained therein generated using the RF waveform. As described below, the RF waveform and the bias waveform may have various configurations.

Figure 7:
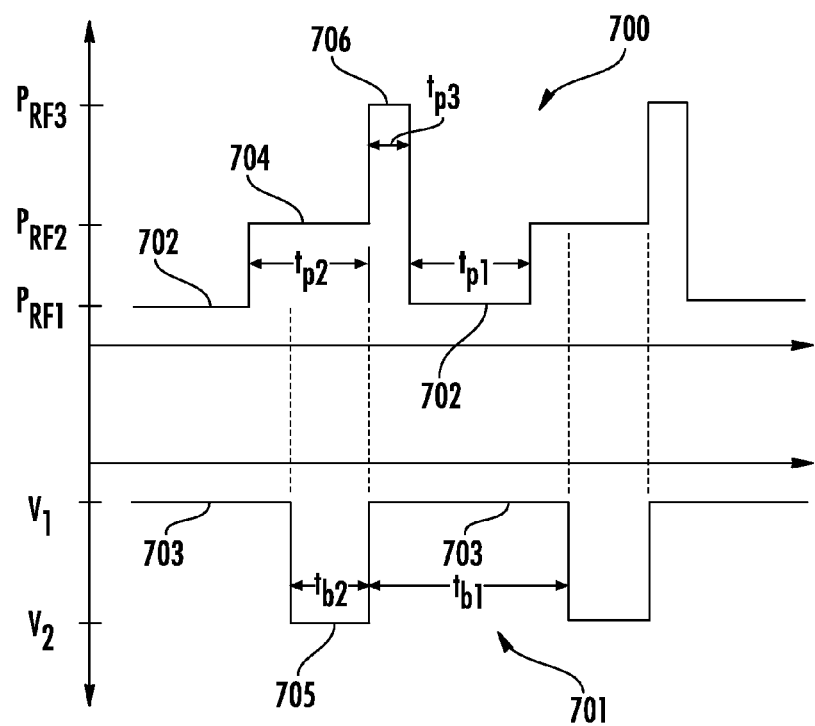
FIG. 7 illustrate a RF power waveform generated by the RF source and bias voltage waveforms generated by the bias voltage supply according to another embodiment of the present disclosure.

Referring to FIG. 7, there are shown an RF power waveform 700 and corresponding bias voltage waveform 701 according to another embodiment of the present disclosure. As illustrated in the figure, the RF power waveform 700 and the bias voltage waveform 701 may comprise a plurality of pulses having different amplitudes. Similar to the earlier embodiments, the RF power waveform 700 may be applied to one or more of the planar coil RF antenna 126 and helical coil RF antenna 128 (FIG. 1), whereas the bias voltage 701 may be applied to the substrate 146 (FIG. 1).

The RF power waveform 700 may comprise first to third RF power pulses 702, 704, and 706 that are applied during three, corresponding RF power periods $t_{p1}$, $t_{p2}$, and $t_{p3}$. As illustrated in the figure, the first RF power pulse 702 may precede the second RF power pulse 704, and the second power pulse 704 may precede the third RF power pulse 706. If desired, additional first to third RF power pulses 702, 704, and 706 may be provided in that order, or in different order.

The first RF pulse 702 may have a first power level $P_{RF1}$, the second RF power pulse 704 may have a second power level $P_{RF2}$, and the third pulse 706 may have a third power level $P_{RF3}$. In the present embodiment, the first power level $P_{RF1}$ may be substantially 0. Alternatively, the first power level $P_{RF1}$ may be greater than 0. Meanwhile, the second power level $P_{RF2}$ may be greater than the first power level $P_{RF1}$, but less than the third power level $P_{RF3}$. For example, the value of the second RF power level $P_{RF2}$ may be about 200 watt, and the value of the third power level $P_{RF3}$ may be 150% to 600% of the second power level $P_{RF2}$, approximately 600 watt. During the second and third RF power periods $t_{p2}$ and $t_{p3}$, when the second and third RF power pulses 704 and 706 are applied, plasma may be generated. Compared to the plasma generated with the application of the second RF power pulses 704, the plasma generated with the application of the third RF power pulse 706 may have different property. For example, the plasma generated with the third RF power pulse 706 may have greater ion and/or electron density.

The width of the third RF power pulse 706 (or the duration of the third RF power period $t_{p3}$) may be about 20% to 50% of the duty cycle. Meanwhile, the width of the second RF power pulse 704 (or the duration of the second RF power period $t_{p2}$) may have an upper limit of approximately 60% of the duty cycle. In a particular example, the width of the second RF power pulse 704 may be about 30-100 µs, but preferably around 90 µs. Meanwhile, the width of the third RF power pulse 706 may be about 10-50 µs, but preferably 30 µs. Those of ordinary skill in the art will recognize that at least one of the widths of the second and third RF power pulses 704 and 706 may change depending on the desired conditions or properties of the plasma and/or the substrate 146.

The bias voltage waveform 701, meanwhile, may comprise a first and second bias pulses 703 and 705. The first bias pulse 703 may have a first bias level $V_1$ and applied during first bias period $t_{b1}$. Meanwhile, the second bias pulse 705 may have a second bias level $V_2$ and applied during second bias period $t_{b2}$. In the present embodiment, the second bias level $V_2$ may have greater absolute value (i.e. more positive or more negative) than the first bias level $V_1$. Meanwhile, the first bias level $V_1$ may be about 0 achieved by turning off the bias provided to the substrate 146 (FIG. 1). Alternatively, the first bias level $V_1$ may have greater absolute value than 0 (i.e. more positive or more negative). If the second bias pulse 705 is provided while ions are proximate to the substrate 146 (FIG. 1), the ions may be attracted and implanted into the substrate 146.

As illustrated in the figure, the first and third RF power periods $t_{p1}$ and $t_{p3}$ may coincide with the first bias period $t_{b1}$. Meanwhile, the second RF power period $t_{p2}$ may coincide with both the first and second bias periods $t_{b1}$ and $t_{b2}$. In other words, the second bias voltage pulse 705 is applied to the substrate 146 (FIG. 1) while the second RF power pulse 704 is applied to one or more of the planar coil RF antenna 126 and helical coil RF antenna 128 (FIG. 1). In the figure, simultaneous application of third RF power pulse 706 and the first bias voltage 703 is shown. However, those of ordinary skill in the art will recognize that there might be some delay, and one of the third RF power pulse 706 and the first bias voltage 703 may be applied after the other one of the third RF power pulse 706 and the first bias voltage 703.

If plasma is generated during the second RF power period $t_{p2}$ with the second RF power pulse 704, application of the second bias pulse 705 to the substrate 146 (FIG. 1) will attract ions from the plasma into the substrate 146. For example, application of negative bias $V_2$ will attract positively charged ions and the positively charged ions will be implanted into the substrate 146. As a result, the substrate 146, and any other material disposed or deposited thereon, may also become positively charged. As such, arcing may occur. The arcing may be worsened if the duty cycle or the pressure inside the process system is increased. By applying the RF power waveform 700 and the bias voltage waveform 701, arcing may be avoided even though the duty cycle or the pressure is increased. In a particular example, an RF power waveform 700 having a second pulse 704 of 300 watt and a third pulse 706 of 600 watt has been applied to the antenna 126 and 128 (FIG. 1) to implant ions into the substrate 146. The pressure of 6 mTorr has been established within the system 100. Despite increasing the duration of the implant (i.e. $t_{b2}$) from 30 to 80 μs, arcing was not observed. In another example, the substrate 146 was processed in the system, where the pressure within the system 100 was about 10 mTorr. In this example, the pressure was increase to further increase the throughput. An RF power waveform 700 having second and third pulses 704 and 706 were applied to at least one of the antennas 126 and 128. The second pulse 704 had a power level of 200, whereas the third pulse 706 had a power level of 600 watt for 30 μs. Despite the increase in the duration of the implant for 90 μs (i.e. $t_{b2}$) arcing was not observed.

Figure 8A:
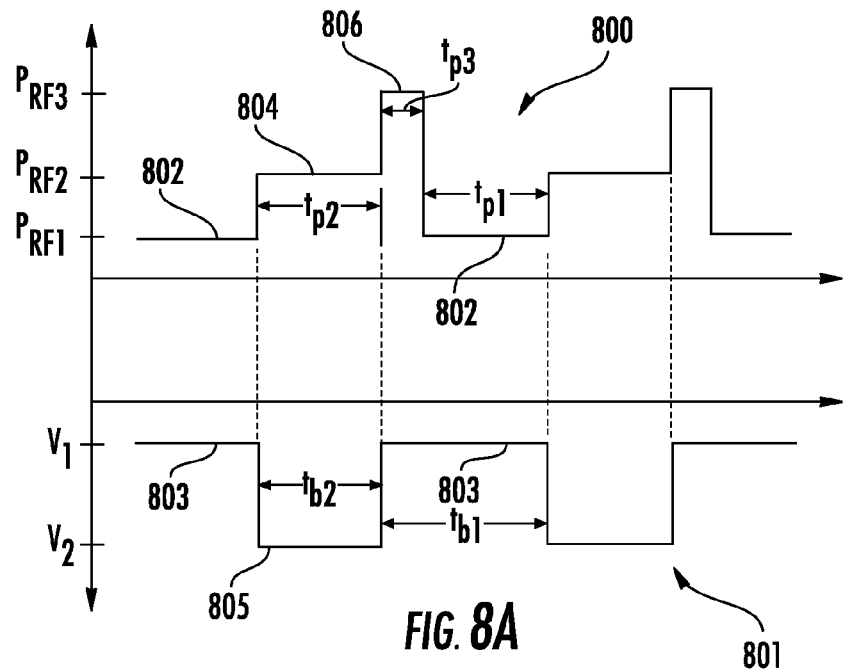
FIGS. 8a and 8b illustrate various RF power waveforms generated by the RF source and bias voltage waveforms generated by the bias voltage supply according to another embodiment of the present disclosure.

Referring to FIG. 8a, there are shown an RF power waveform 800 and corresponding bias voltage waveform 801 according to another embodiment of the present disclosure. In the present embodiment, RF power waveform 800 and the corresponding bias voltage waveform 801 may be applied to one or more of the planar coil RF antenna 126 and helical coil RF antenna 128 and the substrate 146 (see FIG. 1), respectively, to reduce damages and defects induced by PLAD process. As illustrated in the figure, the RF power waveform 800 and the bias voltage waveform 801 may comprise a plurality of pulses having discrete and different amplitudes. However, it should be understood that an RF power waveform with more than three pulses with or without discrete amplitudes may be used. For example, a waveform with continuously changing amplitude may also be used. Also, the waveform can ramp in a linear or in a non-linear rate. Furthermore, it should be noted that the waveform depicts the amplitude of the RF power signal, but not its frequency. Any suitable frequency or set of frequencies may be used to power the antenna 126 and 128 (FIG. 1).

In the present embodiment, the RF power waveform 800 may comprise first to third RF power pulses 802, 804, and 806 that are applied during three corresponding RF power periods $t_{p1}$, $t_{p2}$, and $t_{p3}$. As illustrated in the figure, the first RF power pulse 802 may precede the second RF power pulse 804, and the second power pulse 804 may precede the third RF power pulse 806. If desired, additional first to third RF power pulses 802, 804, and 806 may be provided in that order, or in a different order.

The first RF pulse 802 may have a first power level $P_{RF1}$, the second RF power pulse 802 may have a second power level $P_{RF2}$, and the third pulse 806 may have a third power level $P_{RF3}$. In the present embodiment, the first power level $P_{RF1}$ may be substantially 0. Alternatively, the first power level $P_{RF1}$ may be greater than 0. Meanwhile, the second power level $P_{RF2}$ may be greater than the first power level $P_{RF1}$, but less than the third power level $P_{RF3}$.

The bias voltage waveform 801, meanwhile, may comprise a first and second bias pulses 803 and 805. The first bias pulse 803 may have a first bias level $V_1$ and applied during first bias period $t_{b1}$. Meanwhile, the second bias pulse 805 may have a second bias level $V_2$ and applied during second bias period $t_{b2}$. In the present embodiment, the second bias level $V_2$ may have greater absolute value (i.e. more positive or more negative) than the first bias level $V_1$. Meanwhile, the first bias level $V_1$ may be about 0, achieved by turning off the bias provided to the substrate 146 (FIG. 1). Alternatively, the first bias level $V_1$ may have greater absolute value than 0 (i.e. more positive or more negative). If the second bias pulse 805 is provided while ions are proximate to the substrate 146 (FIG. 1), the ions may be attracted and implanted into the substrate 146.

As illustrated in the figure, the first and third RF power periods $t_{p1}$ and $t_{p3}$ may coincide with the first bias period $t_{b1}$. Meanwhile, the second RF power period $t_{p2}$ may coincide with the second bias period $t_{b2}$. In other words, the second bias voltage pulse 805 is synchronized with the second RF power pulse 804. Sometime after applying the second RF power pulse 804, along with the second bias voltage pulse 805, the third RF power pulse 806 is applied along with the first bias voltage pulse 803. In the figure, simultaneous application of third RF power pulse 706 and the first bias voltage 803 is shown. However, those of ordinary skill in the art will recognize that there might be some delay, and one of the third RF power pulse 806 and the first bias pulse 803 may be applied after application of the other one of the third RF power pulse 806 and the first bias pulse 803.

In operation, the substrate 146 (see FIG. 1) is placed within the plasma based system 100. Thereafter, feed gas may be introduced into the system 100. The feed gas may be a mixture of one or more dopant gases and one or more inert gases. The dopant gas may have dopant species including Boron (B), Phosphorous (P), Arsenic (As), Germanium (Ge), Silicon (Si), Selenium (Se) or Nitrogen (N), or any other species that may alter properties of the substrate 146. The inert gas may have inert species including Hydrogen (H), Oxygen (O), Carbon (C), or any species of noble gas. In the present embodiment, the dopant gas may be diborane ($B_2H_6$) and the inert gas may be Helium (He).

After the feed gas is introduced into the system 100, second RF power pulse with the second RF power level $P_{RF2}$ is applied to at least one of the antennas 126 and 128 (see FIG. 1). In the present embodiment, the amplitude of the second RF power level $P_{RF2}$ may be greater than the ionization energy of $B_2H_6$, but less than the ionization energy of He. The ionization energy is the energy needed to cause a neutral molecule to lose an electron so as to become an ion. Inert gas, such as He, has higher ionization energy than other species including $B_2H_6$. By applying the second RF pulse 804 with amplitude greater than the ionization energy of $B_2H_6$, but less than the ionization energy of He, boron based ions may form. Meanwhile, only small amount of He ions may be generated.

If the second bias pulse 805 applied to the substrate 146 is negative voltage, application of the second bias pulse 805 may result in implantation of positively charged boron ions, and other boron based molecular ions. But because only small amount He ions are generated, only small amount of He ions may be implanted into the substrate 146.

Thereafter, the third RF power pulse 806 with higher RF power level $P_{RF3}$ may be applied to one or more of the planar coil RF antenna 126 and helical coil RF antenna 128 (see FIG. 1). At the same time or near that time, the first bias pulse 803 is applied to the substrate 146. In the present embodiment, the third power level $P_{RF3}$ of the third RF power pulse 806 may be greater than the ionization energy of He. During this time, additional $B_2H_6$ may ionize to form additional positively charged boron based ions. In addition, positively charged He ions may form. As a result, more ions and electrons may be generated. This increased power level may also maintain the plasma stability.

As noted above, implantation of the positively charged ions into the substrate may positively charge the substrate 146. If bias is turned off (e.g. amplitude of the first bias pulse 803 is 0 voltage), additional positively charged ions will not be likely to be implanted into the substrate 146. Instead, electrons in the plasma will be attracted and implanted into the substrate 146. The electrons will electrically neutralize the substrate 146. At the same time, some residual damages on the substrate 146 induced during the implantation of the positively charged ions may be repaired. This cycle may be repeated as desired.

Certain dopant species including P, As and B, may enhance the rate of substrate recrystallization during an anneal step that are performed after the ion implantation process. In some cases, the enhancement may be up to an order of magnitude. However, other species, such as O, C and inert gases, may decrease the recrystallization rate. By minimizing the amount of He ions implanted into the substrate 146 during implantation of B based ions, the technique of the present embodiment may enhance the recrystallization rate that may occur during the subsequent annealing process. In addition, the residual damages induced during the implantation process may decrease. While this description discloses the selection of dopants for implantation rather than inerts, the disclosure is not limited to this embodiment. The present method can be used to selectively introduce one species of ions.

Figure 8B:
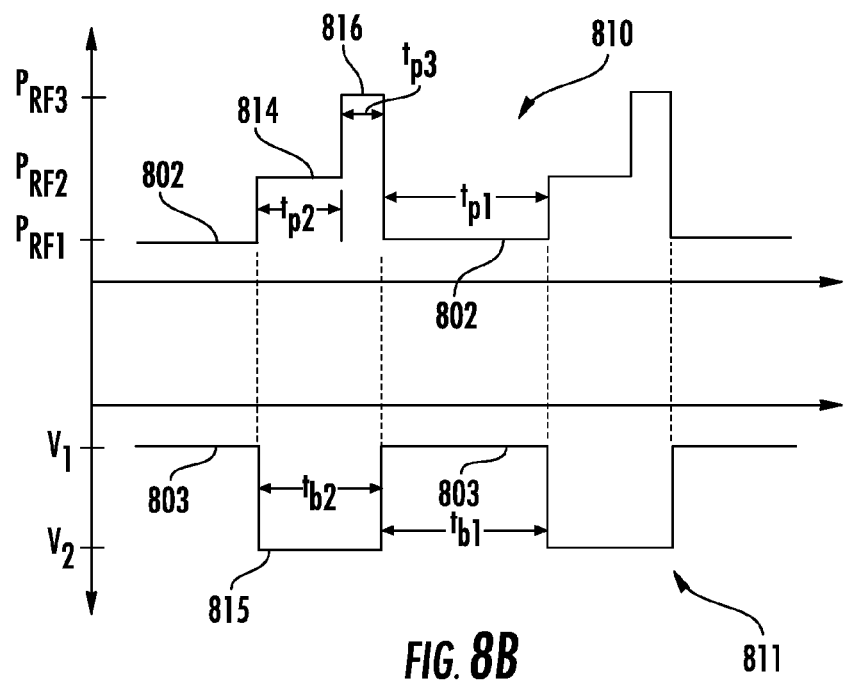

Selective ion implantation and enhancement of the substrate recrystallization may be also achieved by modifying the waveforms 800 and 801. Referring to FIG. 8b, there are shown an RF power waveform 810 and corresponding bias voltage waveform 811 according to another embodiment of the present disclosure. In the present embodiment, the RF power waveform 810 and the bias voltage waveform 811 may be similar to the RF power waveform 800 and the bias voltage waveform 801 shown in FIG. 8a, respectively. However, the second RF power pulse 814 and the third RF power pulse 816 are synchronized with the second bias pulse 815. In other words, the second RF power pulse 814 and the third RF power pulse 816 are sequentially applied to one or more of the planar coil RF antenna 126 and helical coil RF antenna 128 as the second bias pulse 815 is applied to the substrate 146 (see FIG. 1).

In the present embodiment, more He ions generated with the third RF power pulse 816 may be implanted into the substrate 146 compared to the embodiment shown in FIG. 8a. However, the amount may be less than that implanted into the substrate if conventional single RF pulse is used. While FIG. 8b illustrates particular waveform configurations, the present disclosure is not so limited. The duration of the pulses may be selectable based on the species to be implanted and other parameters. In another embodiment, the RF power may be disabled during a portion of the second bias pulse 815. In addition, the RF power waveform 810 may be modified so that the higher RF power level ($P_{RF3}$) remains applied during the application of the first bias pulse 803.

As mentioned above, the application of the second RF power pulse 804 and 814 may selectively introduce ions, while the application of the third RF power pulse 806 and 816 may maintains the plasma state. The amplitude of the second RF power pulse 804 and 814 may be selected so as to ionize only a portion of the species contained in the feed gas. Meanwhile, the third RF power pulse 806 and 816 may also help repair residual damage in the substrate 146. The power levels can be selected based on the ionization energies of the various species in the plasma. Thus, the amplitude and durations of each of these power levels can be varied to modify the composition of ions in the plasma at any point in time, while insuring its stability. By synchronizing these RF power pulses with the bias pulses, the selection and concentration of those species that are implanted may be modified. By doing so, the damage caused in the substrate can be mitigated. In other embodiments, additional power levels can be used, wherein each may cause the ionization of a certain species within the plasma.

It should be noted that FIGS. 8a and 8b show that the lower power level immediately precedes the higher power level. This is not a requirement. For example, the higher power level may precede the lower power level so as to create a stable plasma. In other embodiments, the power may be disabled between the lower and higher power levels.

Figure 9A:
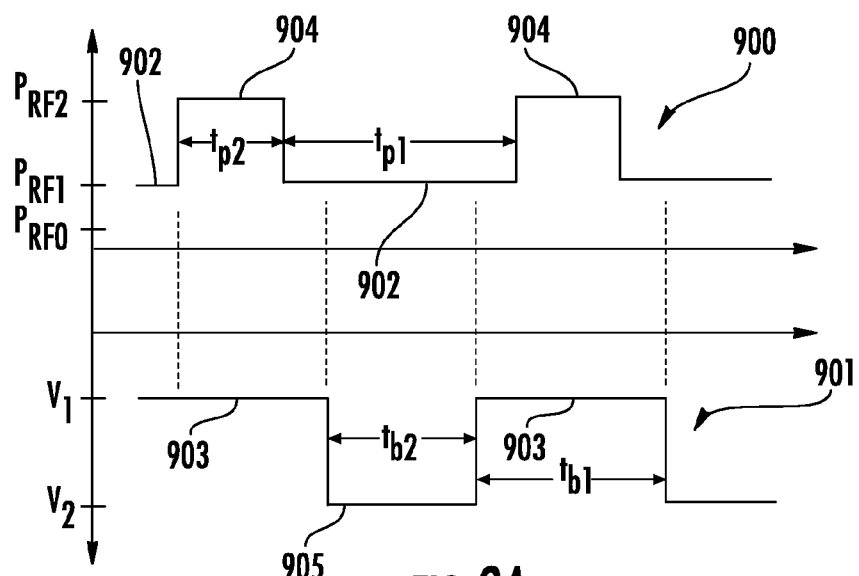
FIGS. 9a and 9b illustrate various RF power waveforms generated by the RF source and bias voltage waveforms generated by the bias voltage supply according to another embodiment of the present disclosure.
Figure 9B:
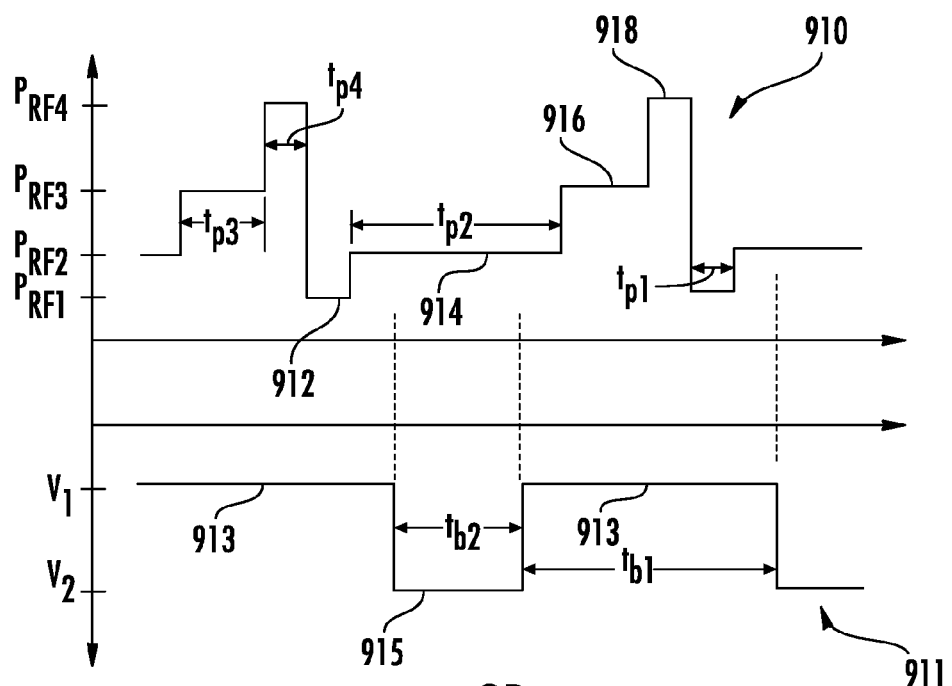

Referring to FIGS. 9a and 9b, there are shown RF power waveforms 900 and 910 and corresponding bias voltage waveforms 901 and 911 according to another embodiment of the present disclosure. In the present embodiment, the RF power waveforms 900 and 910 may be applied to one or more of the planar coil RF antenna 126 and helical coil RF antenna 128 (see FIG. 1). Meanwhile, the corresponding bias voltage waveforms 901 may be applied to the substrate 146 (see FIG. 1). In the process, the electron temperature in the plasma may be controlled.

Referring to FIG. 9a, the RF waveform 900 may comprise first and second RF power pulses 902 and 904 that are applied during first and second RF power periods $t_{p1}$ and $t_{p2}$. As illustrated in the figure, the first RF power pulse 902 may precede the second RF power pulse 904. If desired, additional first and second RF power pulses 902, 904, and 906 may be provided in that order, or in different order.

The first RF pulse 902 may have a first power level $P_{RF1}$, whereas the second RF power pulse 902 may have a second power level $P_{RF2}$. In the present embodiment, the first power level $P_{RF1}$ may be greater than 0. Meanwhile, the second power level $P_{RF2}$ may be greater than the first power level $P_{RF1}$. Compared to the plasma generated with the first RF power pulses 902, the plasma generated with the second RF power pulse 904 may have different properties. For example, the plasma generated with the second RF power pulse 904 may have ion density $N_{i1}$ and electron density $N_{e1}$, and the ion density $N_{i1}$ and electron density $N_{e1}$ may be greater than those $N_{i2}$ and $N_{e2}$ in the plasma generated with the first RF power pulse 902. In addition, the plasma generated with the second RF power pulse 904 may have electron temperature $T_{e1}$ may be greater than the electron temperature $T_{e1}$ in the plasma generated with the first RF power pulse 902.

The bias voltage waveform 901, meanwhile, may comprise a first and second bias pulses 903 and 905. The first bias pulse 903 may have a first bias level $V_1$, and it is applied during the first bias period $t_{b1}$. Meanwhile, the second bias pulse 905 may have a second bias level $V_2$, and it is applied during second bias period $t_{b2}$. In the present embodiment, the second bias level $V_2$ may have greater absolute value (i.e. more positive or more negative) than the first bias level $V_1$. Meanwhile, the first bias level $V_1$ may be about 0 or ground voltage achieved by turning off the bias provided to the substrate 146 (FIG. 1). Alternatively, the first bias level $V_1$ may have greater absolute value than 0 (i.e. more positive or more negative). If the second bias pulse 905 is provided while ions may be proximate to the substrate 146 (FIG. 1), the ions may be attracted and implanted into the substrate 146.

As illustrated in the figure, the second RF power pulse 902 may be applied during the first bias period $t_{b1}$. Meanwhile, the first RF power pulse 902 may be applied during second bias period $t_{p2}$. In other words, the second RF power pulse 904 is applied when the substrate 146 is applied with the first voltage level $V_1$. Meanwhile, the first RF power pulse 902 is applied when the substrate 146 is applied with the second voltage level $V_2$.

In the present embodiment, the waveforms 900 and 901 may be applied to optimize the composition of the particles (e.g. ions, electrons, neutrals, radicals etc. . . . ) in the plasma. For example, the plasma with first electron and ion density $N_{e1}$ and $N_{i1}$, and first electron temperature $T_{e1}$ may be achieved during the application of the first RF power pulse 902. During the application of the second RF power pulse 904, the values of the ion density $N_i$, electron density $N_e$ may increase to higher ion density $N_{i2}$, electron density $N_{e2}$, and electron temperature $T_{e2}$. Meanwhile, the density of the radicals may be less. If additional first RF power pulse 902 is applied, the values of the electron and ion density $N_e$ and $N_{i1}$, and the electron temperature $T_e$ may return to the first electron and ion density $N_{e1}$ and $N_{i1}$, and the first electron temperature $T_{e1}$. By optimizing the power levels of the first and second RF power pulses 902 and 904 and continuously applying the first and second RF power pulses 902 and 904, the value of $N_e$, $N_i$, and $T_e$, thus the composition of the ions and neutrals may also be optimized.

In operation, the substrate 146 (see FIG. 1) is placed within the plasma based system 100. Thereafter, feed gas may be introduced into the system 100. The feed gas may be a mixture of one or more dopant gases and one or more inert gases. The dopant gas may have dopant species including Boron (B), Phosphorous (P), Arsenic (As) or any other species that may alter electrical property of the substrate 146. The inert gas may have inert species including oxygen (O), Carbon (C), or any other species of noble gas. In the present embodiment, the dopant gas may be diborane ($BF_3$).

During $t_{p1}$, singly charged, undissociated molecular ions (e.g. $BF_3^+$) may be preferentially produced in the plasma. Meanwhile, more of the fragmented molecular ions (e.g. $BF_2^{++}$, $BF^{+++}$, etc.) may be produced during $t_{p2}$. By applying the second bias pulse 905 during $t_{p1}$, when the first RF pulse 902 is applied, the substrate 146 may be implanted or processed with more of the singly charged, undissociated molecular ions. As a result, the process may be optimized. For example, better and more controlled depth profile of the implanted ions may be achieved. Although not shown, the present disclosure does not preclude a scenario where the substrate is processed with more of the fragmented molecular ions by applying the bias voltage during the higher power RF level $P_{RF2}$, if such a process is desired. In addition to optimizing the ion implantation, the waveform 900 and 901, may improve etch selectivity when applied during an etch process. If deposition is performed is performed the deposition rate may also be optimized.

In addition, applying the first RF power pulse 902 between two second RF power pulses 904 may result in more uniform and stable plasma. In the conventional pulsed RF power waveform, power pulses with 0 amplitude or nor power may be applied between two RF power pulses. During the application of the RF pulses with 0 amplitude, plasma "afterglow" might occur. During this afterglow, the electron temperature $T_e$ may decay to a much lower level and the plasma sheath may breakdown. Accordingly, the electron and ion density, and the electron temperature may fluctuate rapidly resulting in less stable and uniform plasma. By applying the first RF power pulse 902 with a power level greater than 0 between two second RF power pulses 904 with higher power level, more stable plasma may be maintained. In addition, the ion and neutral composition may be optimized without decreasing the concentration of ions in the plasma.

Other methods of controlling the electron temperature $T_e$ are also possible. Referring to FIG. 9b, the RF waveform 910 may comprise first to fourth RF power pulses 912, 914, 916, and 918 that are applied during corresponding first to fourth RF power periods $t_{p1}$, $t_{p2}$, $t_{p3}$, and $t_{p4}$. As illustrated in the figure, the first RF power pulse 912 may precede the second RF power pulse 914, the second RF power 914 may precede the third RF power pulse 916, and the third RF power 916 may precede the fourth RF power pulse 918.

In this embodiment, the power level of the first RF power pulse 912 may be 0 achieved by turning off the power supply 130 coupled to the antennas 126 and 128. Meanwhile, the second RF power pulse 914 may have a second power level $P_{RF2}$, the third RF power pulse 916 may have a third power level $P_{RF3}$, and the fourth RF power pulse 918 may have a fourth power $P_{RF4}$. The second power level $P_{RF2}$ may be less than third power level $P_{RF3}$, and the third power level $P_{RF3}$ may be less than the fourth RF power pulse 918. By applying the first power pulse 912 for very short duration, the electron temperature $T_e$ may be controlled without destabilizing the plasma. It should be understood that other possible scenarios where various power levels are used to increase and decrease the electron temperature are possible and within the scope of the disclosure.

Hereinafter, additional examples of the waveforms applied to at least one of the antennas 126 and 128 and the substrate 146 are provided. While the above embodiments focus primarily on the techniques for of applying different waveforms to perform ion implantation, the following techniques are described with context to other plasma processing. In particular, the following description focuses on etching and/or deposition for the purpose of clarity and simplicity. The present disclosure, however, does not preclude application of the following method to ion implantation.

In many plasma processing operations, it is desirable to process the substrate conformally, at low temperature. Conformal processing may be defined as uniformly processing surfaces of the substrate that are oriented at different angles or orientations. Examples of a substrate having multiple surfaces in different orientation include FinFET structures and dual damascene structures having horizontally extending and vertically extending surfaces. In ion implanting, etching, or depositing such structures, it is desirable to implant, etch, or deposit differently oriented surfaces uniformly.

Conformality of PECVD process may be improved by operating at a low RF power/low plasma density operating point. The combination of low ion flux and low deposition rates results in improved conformality because film formation proceeds at rates comparable with those of diffusion in the 3D structures. However, low RF power is often associated with plasma and process instability. By using a plurality of RF power levels, pulses at higher power levels can be used to stabilize the plasma. This allows operation in a wider process window.

In addition, conformal deposition process is best performed in the absence of a plasma sheath, which collimates the ions on the substrate. This collimation causes all ions to be directed toward the substrate at the same angle, which makes conformal deposition problematic. One solution is to perform the deposition in the absence of the plasma sheath. In other words, the substrate is biased while there is no power applied to the RF antenna. As noted above, this period is term the plasma afterglow. The main drawback of such an approach is that during afterglow, densities of ions and electrons decreases, which, in turn, results in a low process rate, thereby making the process impractical.

In one embodiment, a RF power waveform having multiple RF power levels can be employed to improve the process rate described above. The use of a high power level creates more ions and electrons, some of which may remain during the plasma afterglow.

Referring to FIG. 10a-10d, there are shown RF power waveform 1000 and corresponding bias voltage waveforms 1001 according to another embodiment of the present disclosure. In the present embodiment, the RF power waveform 1000 and the corresponding bias voltage waveforms 1001 may be applied to one or more of the planar coil RF antenna 126 and helical coil RF antenna 128, and the substrate 146.

Figure 10A:
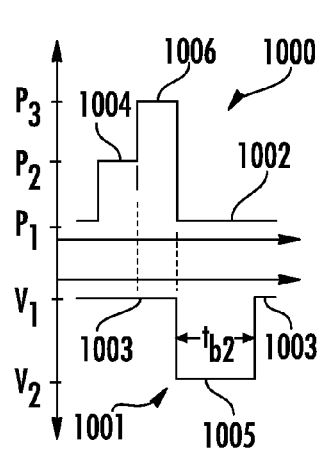
FIG. 10a-10d illustrate various RF power waveforms generated by the RF source and bias voltage waveforms generated by the bias voltage supply according to another embodiment of the present disclosure.

Referring to FIG. 10a, the RF power waveform 1000 comprises first to third RF power pulses 1002, 1004, and 1006 applied to at least one of the RF antennas 126 and 128 during $t_{p1}$, $t_{p2}$, and $t_{p3}$. The first RF power pulse 1002 precedes the second RF power pulse 1004, and the second RF power pulse 1004 precedes the third RF power pulse 1006. If desired, additional first to third RF power pulses 1002, 1004, and 1006 may be provided in that order.

The first RF pulse 1002 may have a first power level $P_1$, the second RF power pulse 1004 may have a second power level $P_2$, and the third pulse 1006 may have a third power level $P_3$. In the present embodiment, the value of the first power level $P_1$ may be zero or greater than zero. Meanwhile, the second power level $P_2$ may be greater than the first power level $P_1$, but less than the third power level $P_3$.

During the second and third RF power periods $t_{p2}$ and $t_{p3}$, when the second and third RF power pulses 1004 and 1006 are applied, plasma may be generated. Compared to the plasma generated with the application of the second RF power pulses 1004, the plasma generated with the application of the third RF power pulse 1006 may have different properties. For example, the plasma generated with the third RF power pulse 706 may have greater ion and/or electron density. Accordingly, the waveform includes rise in the power level from $P_1$ to $P_2$ to $P_3$, with the application of first to third pulses 1002, 1004, and 1006. If the pulses are repeated in that order, the power level may decrease from the third power level $P_3$ to the first power level $P_1$.

The bias voltage waveform 1001, meanwhile, may comprise first and second pulses 1003 and 1005. The first bias pulse 1003 may have a first bias level $V_1$, and it is applied to the substrate 146 (see FIG. 1) during the first bias period $t_{b1}$. The second bias pulse 1005 may have a second bias level $V_2$, and it is applied to the substrate 146 during the second bias period $t_{b2}$. In the present embodiment, the absolute value of the second bias level $V_2$ may be greater than the absolute value of the first bias level $V_1$. As illustrated in the figure, the pulsed width $t_{b2}$ of the second bias pulse 1005 may be greater than the pulsed width $t_{p3}$ of the third RF power pulse 1006.

As illustrated in FIG. 10a, the second and third RF power pulses 1004 and 1006 are applied to at least one of the coils 126 and 128 to generate plasma. During $t_{p3}$, when the third RF power pulse 1006 is applied, the plasma density may increase as the power level increases from $P_2$ to $P_3$. Thereafter, the first RF pulse 1002 is applied, decreasing the power level from $P_3$ to $P_1$. If $P_1$ is near zero and no or minimal RF power is applied during $t_{p1}$, the plasma sheath in the plasma may be reduced or removed. At this time, the second bias pulse 1005 is applied to the substrate 146 (FIG. 1). Ions remaining in the plasma "afterglow" may be attracted to the substrate. If the second bias pulse 1005 is negatively charged, positively charged particles left in the plasma from the application the second and third RF power pulses 1004 and 1006 may be attracted toward the substrate 146. If the second bias pulse 1005 is positively charged, negatively charged particles including negatively charged ions and electrons left in the plasma may be attracted toward the substrate 146. By applying the second bias pulse 1005 after the second and third RF power pulses 1004 and 1006, the plasma sheath may no longer be present. The ions near the substrate 146 are no longer collimated, but disposed in a more random manner. This cycle can be repeated as necessary.

Figure 10B:
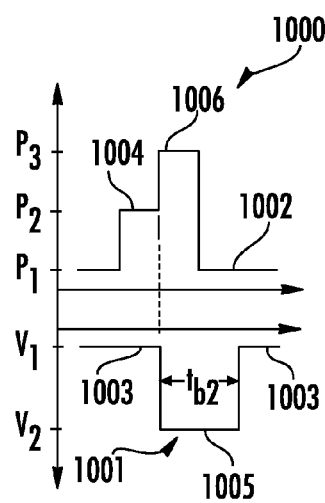
Figure 10C:
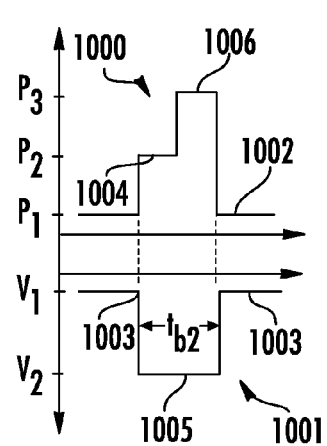
Figure 10D:
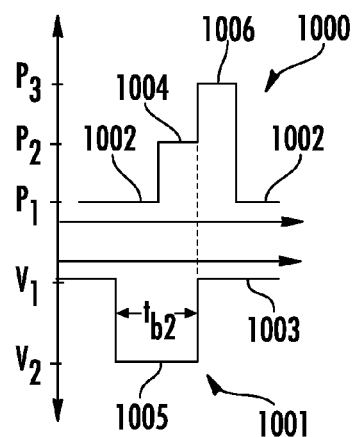

In the present disclosure, the RF power pulse waveform and the bias voltage waveform may be modified in many ways. For example, synchronization of the waveforms may be modified. Referring to FIG. 10b-10d, there are shown modifications to synchronization of the RF power waveforms 1000 and the bias voltage waveform 1001 illustrated in FIG. 10a. Each RF power waveform shown in the FIG. 10b-10d is identical to one another and identical to that shown in FIG. 10a. In addition, each bias voltage waveform shown in FIG. 10b-10d is also identical to one another and also identical to that shown in FIG. 10a. However, synchronization of the RF power waveform and bias voltage waveform may be different.

In FIG. 10b, the second bias pulse 1005 of the bias voltage waveform 1001 is synchronized with the third RF power pulse 1006. The second bias pulse 1005, however, is not synchronized with the second RF power pulse 1004. As such, the second bias voltage pulse 1005 is applied while the third RF power pulse 1006 with the highest RF power $P_3$ is applied. The second bias voltage pulse 1005 is not applied when the second RF power pulse 1004 is applied.

In FIG. 10c, the second bias voltage pulse 1005 is synchronized with the second and third RF power pulses 1004 and 1006. In FIG. 10d, the second bias voltage pulse 1005 is synchronized with only the second RF power pulse 1004.

Figure 11A:
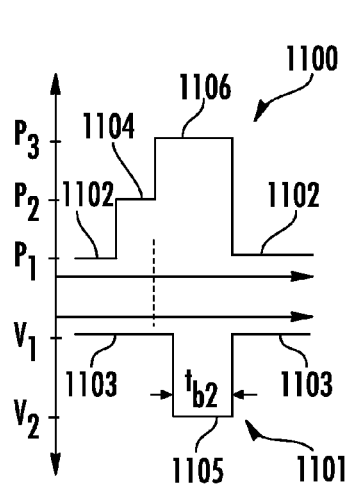
FIG. 11a-11e illustrate various RF power waveforms generated by the RF source and bias voltage waveforms generated by the bias voltage supply according to another embodiment of the present disclosure.
Figure 11B:
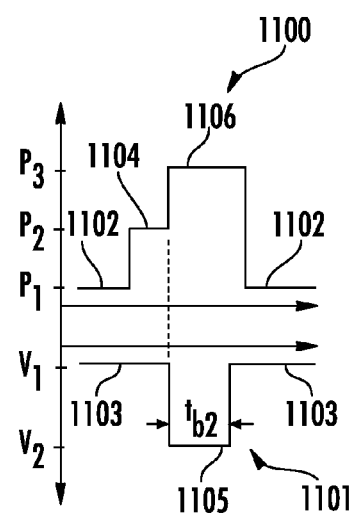
Figure 11C:
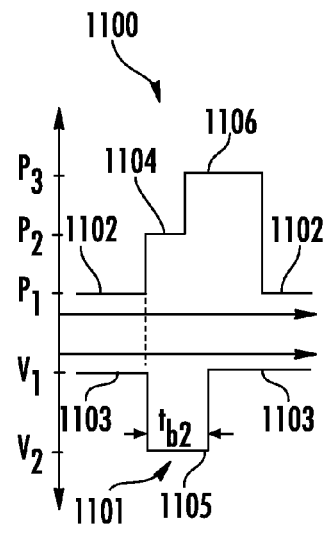

Referring to FIG. 11a-11c, there are shown RF power waveform 1100 and corresponding bias voltage waveforms 1101 according to another embodiment of the present disclosure. In this embodiment, the RF power waveform 1100 may comprise first to third RF power pulses 1102, 1104, and 1106. It should be understood that additional first to third RF power pulses 1102, 1104, and 1106 may be provided in the waveform 1100 in that order. Meanwhile, the bias voltage waveform 1101 may comprise first and second bias pulses 1103 and 1105. It should be understood that additional first and second bias pulses 1103 and 1105 may be provided in the waveform 1101 in that order.

Compared to the RF power waveform 1000 shown in FIG. 10a, the RF power waveform of the present embodiment has many similarities. For example, the order of the pulses may be identical to the order of the pulses in the RF power waveform 1000 shown in FIG. 10a. In addition, relative power level of the pulses 1102, 1104, and 1106 may be similar to the relative power level of the pulses 1002, 1004, and 1006 shown in FIG. 10a. Meanwhile, the order and the relative power level of the bias pulses 1003 and 1005 of the bias waveform 1101 may be similar to those of the bias pulses 1003 and 1005 shown in FIG. 10a.

However, the pulse width of the third RF power pulse 1106 may be different. For example, the third RF power pulse 1106 may have a pulse width $t_{b3}$ that is greater than the pulsed width of the third RF power pulse 1006 shown in FIG. 10a. Compared to the pulse width $t_{b2}$ of the second bias voltage pulse 1105, the pulse width $t_{p3}$ of the third RF power pulse 1106 of the present embodiment may be greater.

Figure 11D:
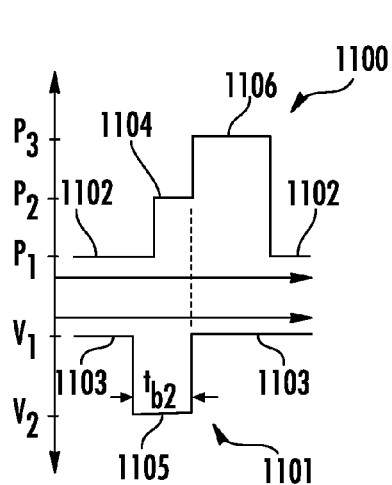

In FIG. 11b-11d, identical RF power waveforms and identical bias voltage waveforms are shown. Each of the RF power waveforms shown in FIG. 11b-11d is identical to one another and to the RF waveform shown in FIG. 11a. Each of the bias voltage waveforms shown in FIG. 11b-11d is identical to one another and to the bias voltage waveform shown in FIG. 11a. One difference may be in the synchronization of the RF power pulses 1102, 1104, and 1106, relative to the bias voltage pulses 1103 and 1105.

Figure 11E:
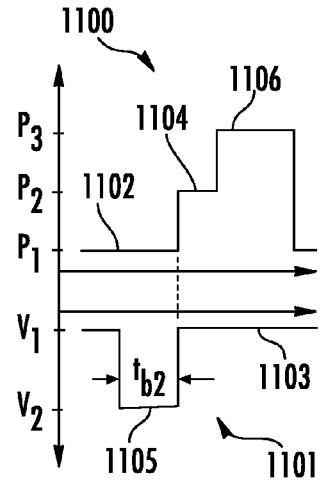

In FIG. 11b, the third RF power pulse 1106 is synchronized with the second bias pulse 1105 such that both pulses are applied simultaneously or approximately at the same time. In FIG. 11c, the second bias pulse 1105 is synchronized with the second RF power pulse 1104 and a portion of the third RF power pulse 1106. In FIG. 11d, the second bias pulse 1105 is synchronized with the second RF power pulse 1104, but not the third RF power pulse 1106. In FIG. 11e, the second bias pulse 1105 is synchronized with the first RF power pulse 1102. Although not shown in the figure, it should be understood that the first RF power pulse 1102 that is synchronized with the first RF power pulse 1102 may follow the third RF power pulse 1106. Using these waveforms, ions during plasma afterglow and during plasma glow may be used to process the substrate (see FIG. 1).

Referring to FIG. 12a-12d, there are shown RF power waveform 1200 and corresponding bias voltage waveforms 1201 according to another embodiment of the present disclosure. In this embodiment, the RF power waveform 1200 may comprise first to third RF power pulses 1202, 1204, and 1206. It should be understood that additional first to third RF power pulses 1202, 1204, and 1206 may be provided in the waveform 1200 in that order. Meanwhile, the bias voltage waveform 1201 may comprise first and second bias pulses 1203 and 1205. It should be understood that additional first and second bias pulses 1203 and 1205 may be provided in the waveform 1101 in that order.

In the present embodiment, the power level of the first RF power pulse 1202 is greater than the power levels of the second and third power pulses 1204 and 1206. In addition, the power level of the second RF power pulse 1204 is greater than the power level of the third RF power pulse 1206. As such, the second RF power pulse 1204, is preceded by the first RF power pulse 1206 having the highest power level $P_3$. The second RF power pulse 1204, meanwhile, precedes the third RF power pulse 1206 which has the lowest power level $P_3$.

The second voltage pulse 1205 of the voltage waveform 1201 has pulse width of the $t_{b2}$ and a voltage level of $V_2$. Similar to the first bias pulses of earlier embodiments, the absolute value of the voltage level of the first bias pulse 1203 may be 0 or greater than 0 (e.g. more negative or more positive).

Figure 12A:
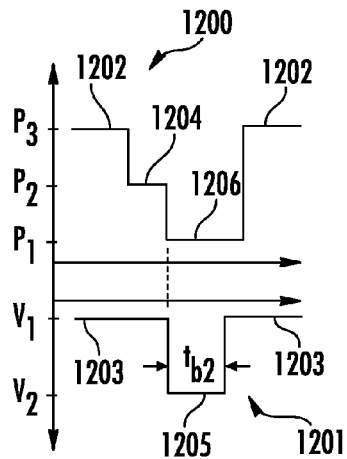
FIG. 12a-12d illustrate various RF power waveforms generated by the RF source and bias voltage waveforms generated by the bias voltage supply according to another embodiment of the present disclosure.

As illustrated in FIG. 12a, the second bias pulse 1205 is synchronized with the third RF power pulse 1206 having the lowest power level $P_1$. Meanwhile, the first and second RF power pulses 1202 and 1204 having higher RF power level $P_3$ and $P_2$, may coincides with the first bias pulse 1203.

Figure 12B:
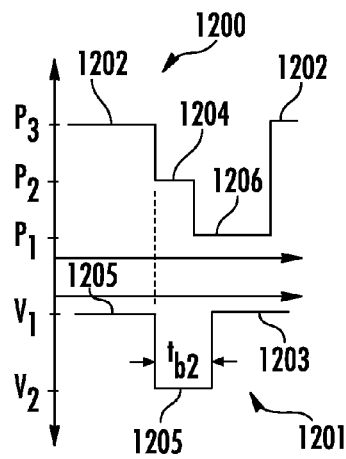
Figure 12C:
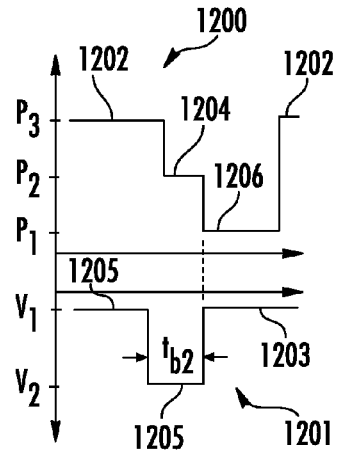
Figure 12D:
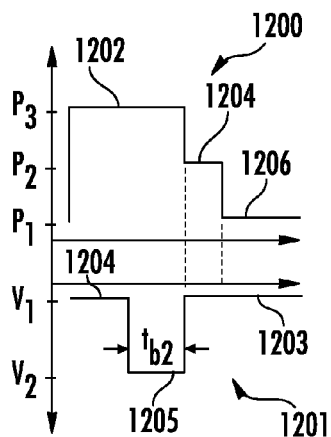

In FIG. 12b-12d, identical RF power waveforms and identical bias voltage waveforms are shown. Each of the RF power waveforms shown in FIG. 12b-12d is identical to one another and to the RF waveform shown in FIG. 12a. Each of the bias voltage waveforms shown in FIG. 12b-12d is identical to one another and to the bias voltage waveform shown in FIG. 12a. One difference between the waveforms shown in FIG. 12a-12d may be in the synchronization of the RF power pulses 1202, 1204, and 1206, relative to the bias voltage pulses 1203 and 1205.

In FIG. 12b, the second bias pulse 1205 is synchronized with the second RF power pulse 1204 and a portion of the third RF power pulse 1206. In FIG. 12c, the second bias pulse 1205 is synchronized with the second RF power pulse 1204, and a portion of the first RF power pulse 1202. In FIG. 12d, the second bias pulse 1205 is synchronized with the first RF power pulse 1202.

Referring to FIG. 13a-13e, there are shown RF power waveform 1300 and corresponding bias voltage waveforms 1301 according to another embodiment of the present disclosure. In this embodiment, the RF power waveform 1300 may comprise first to third RF power pulses 1302, 1304, and 1306. It should be understood that additional first to third RF power pulses 1302, 1304, and 1306 may be provided in the waveform 1300, in that order. Meanwhile, the bias voltage waveform 1301 may comprise first and second bias pulses 1303 and 1305. It should be understood that additional first and second bias pulses 1303 and 1305 may be provided in the waveform 1301 in that order.

In the present embodiment, the power level of the first RF power pulse 1302 is greater than the power levels of the second and third power pulses 1304 and 1306. In addition, the power level of the second RF power pulse 1304 is less than the power level of the third RF power pulse 1306. As such, the RF power pulse having the lowest power level is disposed between the first power pulse 1302 having the highest power level $P_3$ and the third RF power pulses 1306 having the intermediate power levels $P_2$. Similar to the power level of the RF power waveforms shown in FIG. 10a-10d, 11a-11e, and 12a-12d, the power level of the RF pulse having the lowest power level may be zero power or greater.

The second voltage pulse 1305 of the voltage waveform 1301 has pulse width of the $t_{b2}$ and a voltage level of $V_2$. Similar to the first bias pulses of earlier embodiments, the absolute value of the voltage level of the first bias pulse 1203 may be 0 or greater than 0 (e.g. more negative or more positive).

Figure 13A:
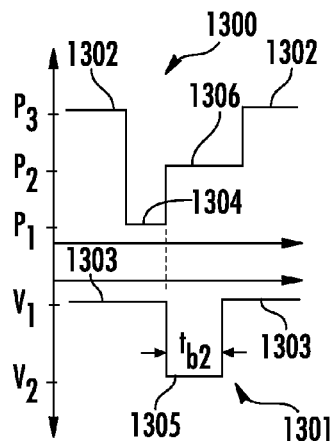
FIG. 13a-13e illustrate various RF power waveforms generated by the RF source and bias voltage waveforms generated by the bias voltage supply according to another embodiment of the present disclosure.

As illustrated in FIG. 13a, the second bias pulse 1305 is synchronized with the third RF power pulse 1306 having the intermediate power level $P_2$. Meanwhile, the first and second RF power pulses 1302 and 1304 respectively having RF power levels $P_3$ and $P_1$ may coincide with the first bias pulse 1303.

Figure 13B:
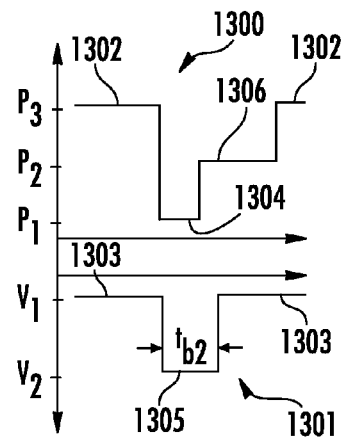
Figure 13C:
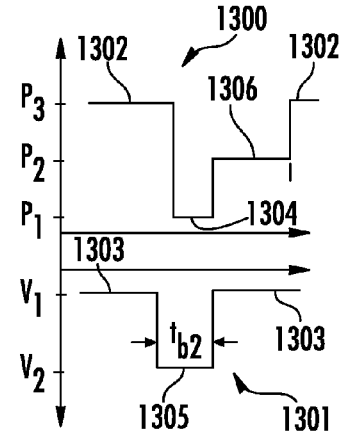
Figure 13D:
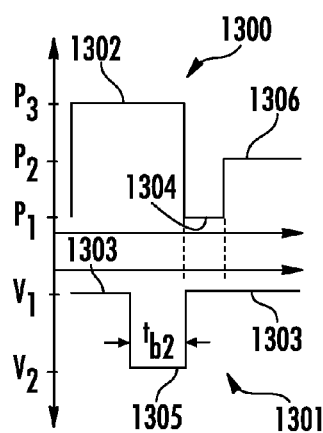

In FIG. 13b-13e, identical RF power waveforms and identical bias voltage waveforms are shown. Each of the RF power waveforms shown in FIG. 13b-13e is identical to one another and to the RF waveform shown in FIG. 13a. Each of the bias voltage waveforms shown in FIG. 13b-13d is identical to one another and to the bias voltage waveform shown in FIG. 13a. One difference between the waveforms shown in FIG. 13a-13e may be in the synchronization of the RF power pulses 1302, 1304, and 1306, relative to the bias voltage pulses 1303 and 1305.

Figure 13E:
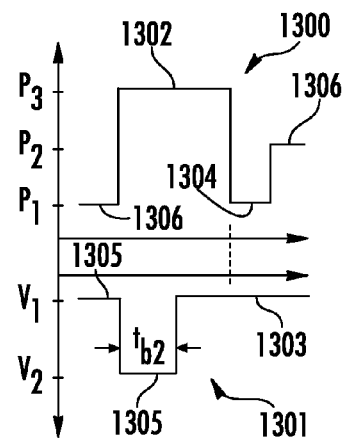

In FIG. 13b, the second bias pulse 1305 coincides with the second RF power pulse 1204 and a portion of the third RF power pulse 1206 having the lowest RF power and intermediate RF power $P_1$ and $P_2$, respectively. In FIG. 13c, the second bias pulse 1305 coincides with the second RF power pulse 1304, and a portion of the first RF power pulse 1302. In FIGS. 13d and 13e, the second bias pulse 1305 coincides with the first RF power pulse 1302.

Referring to FIG. 14a-14e, there are shown RF power waveform 1400 and corresponding bias voltage waveforms 1401 according to another embodiment of the present disclosure. In this embodiment, the RF power waveform 1400 may comprise first to third RF power pulses 1402, 1404, and 1406. It should be understood that additional first to third RF power pulses 1402, 1404, and 1406 may be provided in the waveform 1400, in that order. Meanwhile, the bias voltage waveform 1401 may comprise first and second bias pulses 1403 and 1405. It should be understood that additional first and second bias pulses 1403 and 1405 may be provided in the waveform 1301 in that order.

Compared to RF power pulses 1302, 1304, 1306 of the RF power waveform 1300 shown in FIG. 13a, the pulses 1402, 1404, and 1406 may have the same relative power levels. As such, the power level of the first RF power pulse 1402 is greater than the power levels of the second and third power pulses 1404 and 1406. In addition, the power level of the second RF power pulse 1404 is less than the power level of the third RF power pulse 1406. As such, the RF power pulse having the lowest power level is disposed between the first power pulse 1402 having the highest power level $P_3$ and the third RF power pulse 1306 having the intermediate power levels $P_2$. Similar to the power level of the RF power waveforms shown in FIG. 10a-10d, 11a-11e, and 12a-12d, the power level of the RF pulse having the lowest power level may be zero power or greater.

The second voltage pulse 1305 of the voltage waveform 1301 has pulse width of the $t_{b2}$ and a voltage level of $V_2$. Similar to the first bias pulses of earlier embodiments, the absolute value of the voltage level of the first bias pulse 1203 may be 0 or greater than 0 (e.g. more negative or more positive).

Figure 14A:
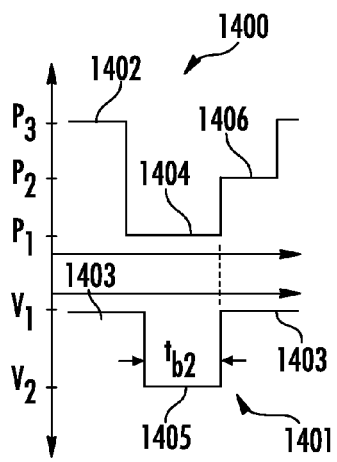
FIG. 14a-14e illustrate various RF power waveforms generated by the RF source and bias voltage waveforms generated by the bias voltage supply according to another embodiment of the present disclosure.

One difference between the pulses of the RF power waveform 1400 shown in FIG. 14a and those shown in FIG. 13a is that the pulse width $t_{p2}$ of the second RF pulse 1404 is greater than the pulse width $t_{b2}$ of the second bias pulse 1405.

As illustrated in FIG. 14a, the second bias pulse 1405 coincides with the second RF power pulse 1404 having the lowest power level $P_1$. Meanwhile, the first and third RF power pulses 1402 and 1406 respectively having RF power levels $P_3$ and $P_2$ may coincide with the first bias pulse 1403.

Figure 14B:
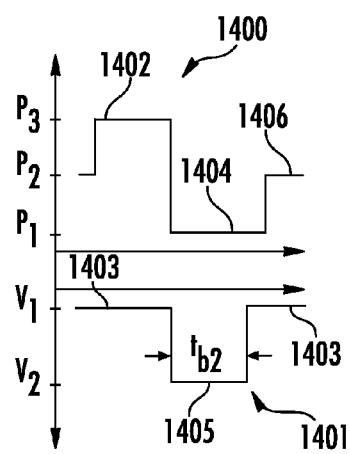
Figure 14C:
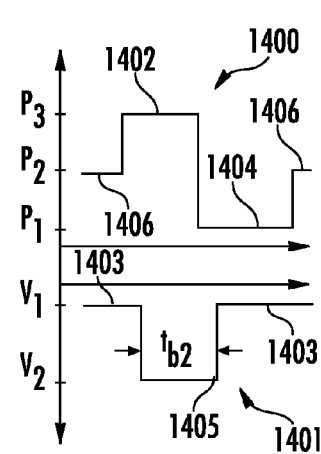
Figure 14D:
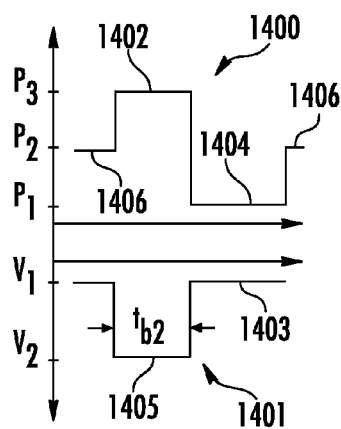
Figure 14E:
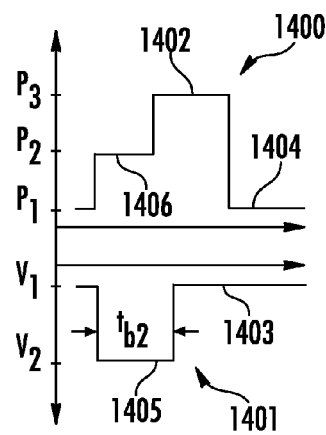

In FIG. 14b-14e, identical RF power waveforms and identical bias voltage waveforms are shown. Each of the RF power waveforms shown in FIG. 14b-14e is identical to one another and to the RF waveform shown in FIG. 14a. Each of the bias voltage waveforms shown in FIG. 14b-14d is identical to one another and to the bias voltage waveform shown in FIG. 14a. One difference between the waveforms shown in FIG. 14a-14e may be in the synchronization of the RF power pulses 1402, 1404, and 1406, relative to the bias voltage pulses 1403 and 1405.

In FIG. 14b, the second bias pulse 1405 coincides with the second RF power pulse 1404. In FIG. 14c, the second bias pulse 1405 coincides with a portion of the first RF power pulse 1402, and a portion of the second RF power pulse 1404. In FIG. 14d, the second bias pulse 1405 coincides with the first RF power pulse 1402. And, in FIG. 14e, the second bias pulse 1405 may be synchronized with the third RF power pulse 1406 and a portion of the first RF power pulse 1402.

In addition to doping, the waveform configurations shown herein may be used for etching process. For example, the etching rate is often controlled by the plasma chemical composition. Therefore, it may be beneficial to modulate the active radical species concentrations, pressure, electron temperature and plasma density to effect changes in the etching rate, selectivity, uniformity and/or etched feature profile. As described above, changes in the power level applied to the RF antenna can affect the species that become ionized, the number of ions and electrons, the electron temperature, and the plasma density. Therefore, the multi-set point RF generator described above can also be used to control the various parameters associated with the chemical etching process.

EQUIVALENTS

The present disclosure is described in detail with reference to exemplary embodiments thereof as shown in the accompanying drawings. While the present disclosure is described in conjunction with various embodiments and examples, it is not intended that the present teachings be limited to such embodiments. On the contrary, the present disclosure encompasses various alternatives, modifications and equivalents, as will be appreciated by those of skill in the art. Those of ordinary skill in the art having access to the teachings herein will recognize additional implementations, modifications, and embodiments, as well as other fields of use, which are within the scope of the present disclosure as described herein. For example, it should be understood that the methods for plasma processing according to the present disclosure can be used with any type of plasma source.

What is claimed is:

1. A method of plasma processing a substrate, the method comprising:
   introducing a feed gas to a plasma processing system comprising a plasma source, the feed gas comprising a first and second species, the first and second species having different ionization energies;
   providing a multi-level RF power waveform to the plasma source, the multi-level RF power waveform having at least a first power level during a first pulse duration and a second power level during a second pulse duration, the second power level being greater than the first power level, and the first power level is greater than a power level necessary to ionize the first species but less than another power level necessary to ionize the second species;
   ionizing the first species of the feed gas during the first pulse duration;
   ionizing the second species during the second pulse duration;
   providing a bias to the substrate during the first pulse duration; and
   not biasing the substrate during the second pulse duration.

2. The method of claim 1 wherein the first species comprises a dopant species.

3. The method of claim 2, wherein the dopant species comprises at least one of P, B, Ge, Si, N, and As, and Se, and the second species comprises at least one of H, C, O, He, Ne, and Ar.

4. The method of claim 1, wherein the first species is an etchant so as to etch the substrate.

5. The method of claim 1 wherein the second RF power level is sufficient to stabilize a plasma.

6. A method of processing a substrate, the method comprising:
   introducing a feed gas comprising a first species and second species into a plasma processing system comprising a plasma source, the first species having lower ionization energy than the second species;
   applying a first power level to the plasma source during a first period to selectively ionize the first species, the first power level being greater than a power level necessary to ionize the first species but less than another power level necessary to ionize the second species;
   applying a second power level to the plasma source during a second period to ionize the second species, the second power level being greater than the another power level necessary to ionize the second species; and directing ions of the first species toward a substrate during the first period.

7. The method of claim 6, further comprising:

directing ions of the second species toward the substrate during the second period.

8. The method of claim 7, further comprising:

implanting ions of the first species into the substrate during the first period; and implanting ions of the second species into the substrate during the second period.

9. The method of claim 8, wherein the first species comprises at least one of P, B, Ge, Si, N, Se, and As, and the second species comprises at least one of H, C, O, He, Ne, and Ar.

10. The method of claim 7, further comprising:

biasing the substrate during the first period and biasing the substrate during the second period.

11. The method of claim 6, further comprising:

biasing the substrate during the first period without biasing the substrate during the second period.

12. A method of plasma processing a substrate in an apparatus comprising a plasma source proximate to a substrate, an RF power supply electrically coupled to the plasma source, a bias power supply electrically coupled to the substrate, the method comprising:

introducing a feed gas to the apparatus, the feed gas comprising at least first and second species;

generating an RF waveform having a first power level during a first period, a second power level during a second period and a third power level during a third period with the RF power supply, wherein the second power level is greater than the first power level and the third power level is less than the first and second power levels, wherein the first power level is greater than a power level necessary to ionize the first species but less than another power level necessary to ionize the second species, and wherein the second period occurs after the first period and the third period occurs after the second period;

applying the RF waveform to the plasma source so as to generate a plasma during at least the first and second periods;

generating a bias waveform with the bias power supply, the bias waveform having a first bias level and a second bias level, the second bias level being more negative than the first bias level; and, applying the bias waveform to the substrate to direct ions from the plasma toward the substrate.

13. The method of claim 12, wherein the first bias level is applied to the substrate during the first period.

14. The method of claim 12, wherein the second bias level is applied to the substrate after the second period.

15. The method of claim 12, wherein the second bias level is applied to the substrate during the second period.

16. The method of claim 12, wherein the second bias level is applied to the substrate during the first period.

17. The method of claim 12, wherein the first bias level is applied to the substrate during the third period.

18. The method of claim 12, wherein the plasma is not extinguished during the third period.

19. The method of claim 12, wherein the second power level is greater than the another power level necessary to ionize the second species.

* * * * *